United States Patent
Sim et al.

(10) Patent No.: US 8,592,273 B2
(45) Date of Patent: Nov. 26, 2013

(54) METHOD OF MANUFACTURING NONVOLATILE MEMORY DEVICE

(75) Inventors: Jae-Hwang Sim, Seoul (KR); Keon-Soo Kim, Hwaseong-di (KR); Kyung-Hoon Min, Seoul (KR); Min-Sung Song, Hwaseong-si (KR); Yeon-Wook Jung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 247 days.

(21) Appl. No.: 13/230,228

(22) Filed: Sep. 12, 2011

(65) Prior Publication Data

US 2012/0064710 A1 Mar. 15, 2012

(30) Foreign Application Priority Data

Sep. 14, 2010 (KR) .................. 10-2010-0089823

(51) Int. Cl.
*H01L 21/336* (2006.01)

(52) U.S. Cl.
USPC .......................................................... 438/257

(58) Field of Classification Search
None
See application file for complete search history.

(56) References Cited

U.S. PATENT DOCUMENTS

| | | | |
|---|---|---|---|
| 6,720,610 B2 | 4/2004 | Iguchi et al. | |
| 6,765,258 B1 * | 7/2004 | Wu | 257/315 |
| 7,041,554 B2 * | 5/2006 | Lee et al. | 438/257 |
| 2008/0054345 A1 | 3/2008 | Park et al. | |

FOREIGN PATENT DOCUMENTS

| | | |
|---|---|---|
| JP | 2001168306 A | 6/2001 |
| KR | 100769151 B1 | 10/2007 |
| KR | 100852236 | 8/2008 |

* cited by examiner

*Primary Examiner* — Thao Le
*Assistant Examiner* — Andre' C Stevenson
(74) *Attorney, Agent, or Firm* — Harness, Dickey & Pierce, P.L.C.

(57) ABSTRACT

In a non-volatile memory device and method of manufacturing the same, a device isolation pattern and an active region extend in a first direction on a substrate. A first dielectric pattern is formed on the active region of the substrate. Conductive stack structures are arranged on the first dielectric pattern and a recess is formed between a pair of the adjacent conductive stack structures. A protection layer is formed on a sidewall of the stack structure to protect the sidewall of the stack structure from over-etching along the first direction. The protection layer includes an etch-proof layer having oxide and arranged on a sidewall of the floating gate electrode and a sidewall of the control gate line and a spacer layer covering the sidewall of the conductive stack structures.

13 Claims, 14 Drawing Sheets

METHOD OF MANUFACTURING NONVOLATILE MEMORY DEVICE

CROSS-REFERENCE TO RELATED APPLICATIONS

This application claims the benefit of priority under 35 U.S.C. §119(e) from Korean Patent Application No. 10-2010-0089823 filed on Sep. 14, 2010, in the Korean Intellectual Property Office, the disclosure of which is incorporated herein by reference in its entirety.

BACKGROUND

1. Field

Example embodiments relate to a nonvolatile memory device and a method of manufacturing the same, and more particularly, to a flash memory device and a method of manufacturing the same.

2. Description of the Related Art

In general, non-volatile memory devices (e.g., flash memory devices) can maintain data stored therein even when the power is shut off, and thus the non-volatile memory devices have been widely used for data storage devices. For example, the non-volatile memory devices may have been used as a ROMBIOS for a personal computer, a storage memory for a setup box, a server system for a printer system and various network systems. Recently, the non-volatile memory devices may have been used as a memory system for a digital camera and a mobile phone.

The flash memory device can electrically store (program) or erase data by the unit of a sector of memory cells by increasing or decreasing the threshold voltage of cell transistors of the memory cells. Hot electrons may be generated at the drain electrode of the cell transistor and accumulate in the floating gate through the channel of the cell transistor, increasing the threshold voltage of the gate electrode of the cell transistor. The data is programmed in the memory cell of the flash memory device as a binary code of '1'. In contrast, when a high voltage is applied between the source electrode and the floating gate of the cell transistor, the accumulated hot electrons are discharged from the floating gate to the substrate through the channel, decreasing the threshold voltage of the gate electrode. Therefore, the data is erased from the cell transistor of the flash memory device and the memory cell is allocated as a binary code of '0'.

A cell transistor of the flash memory cell generally includes a stack gate structure, and source and drain regions at both sides of the stack gate structure on an active region of a semiconductor substrate. A tunnel oxide layer, a floating gate, a dielectric layer and a control gate are sequentially stacked on the active region of the substrate to form the stack gate structure, and the source/drain regions may be arranged at surface portions of the active region of the substrate adjacent to the stack gate structure. A channel is positioned under the stack gate structure. The source and drain regions may be spaced apart by the channel region.

Conventionally, the stack gate structure is formed on the substrate by consecutive first and second etching processes. A floating gate pattern is formed on the substrate along a direction of a bit line of the flash memory device by the first etching process. Then, the floating gate pattern process is node-separated into a plurality of floating gates at each cell, and a control gate line is formed on the floating gates along a direction of the word line of the flash memory device by the second etching process.

Particularly, the floating gate pattern is formed into a line shape along a first direction on a tunnel insulation layer of the substrate by the first etching process. Then, the dielectric layer is formed on the floating gate pattern to cover the floating gate pattern and a device isolation layer, and a control gate layer is formed on the dielectric layer. The control gate layer, the dielectric layer and the floating gate pattern are sequentially etched off as a line shape along a second direction perpendicular to the first direction by the second etch process, to thereby form the control gate line, a dielectric pattern under the control gate pattern and the node-separated floating pattern under the dielectric pattern. The active regions at both sides of the node-separated floating gate pattern are exposed and self-aligned with the floating gate pattern in the second etching process. The active regions exposed at both sides of the floating gate pattern are provided as source/drain regions of the memory devices. A cell transistor is formed on the substrate including the stack gate structure in which the floating gate pattern, the dielectric pattern and the control gate pattern are stacked on the tunnel insulation layer and the source/drain electrodes at both sides of the stack gate structure.

When the second etching process is excessively performed in a direction of the bit line of the memory device, the control gate line and the floating gate pattern are over etched, and thus widths of the control gate line and the floating gate pattern are significantly reduced along the bit line direction. Accordingly, a number of charge trap sites are generated on the dielectric pattern between the control gate line and the floating gate pattern, which deteriorates the data retention characteristics of the flash memory device.

FIG. 1 is a perspective view illustrating a structure of a conventional flash memory device.

As illustrated in FIG. 1, side surfaces of the control gate line 50 and the floating gate pattern 30 are usually over-etched in the second etching process along the bit line direction which is in parallel with a direction of the line-shaped active region A of the substrate 10, and thus first and second uncovered areas U1 and U2 are usually provided with the conventional flash memory device. Some of the tunnel insulation layer and the dielectric pattern are not covered with the floating gate pattern 30, and thus a top surface of the tunnel insulation layer and a lower surface of the dielectric pattern are partially exposed to the first uncovered area U1. In the same way, some of the dielectric pattern is not covered with the control gate line 50, and thus an upper surface of the dielectric pattern is partially exposed to the second uncovered area U2.

When an ion implantation process is performed onto surface portions of the active region A of the substrate 10 at both sides of the stack gate structure, ion charges are usually implanted onto the uncovered dielectric pattern 40, as well as the source/drain regions, to thereby form the charge trap sites on the dielectric pattern 40.

When the stack gate structure including the charge trap sites is used as a cell transistor or a selection transistor of the flash memory device, the charges captured by the floating gate pattern tend to travel into the charge trap sites of the dielectric pattern 40 by thermal energy of a room temperature. Therefore, the binary data at the cell transistor may be unexpectedly erased and the data retention characteristics of the flash memory device are substantially deteriorated.

Accordingly, there is still a need for a flash memory device in which the dielectric pattern is sufficiently covered, and thus no charge trap sites are provided on the dielectric pattern, to thereby increase the data retention characteristics of the flash memory device.

SUMMARY

Example embodiments relate to a nonvolatile memory device and a method of manufacturing the same, and more particularly, to a flash memory device and a method of manufacturing the same.

Example embodiments of the present inventive concepts provide a method of manufacturing a non-volatile memory device in which over-etching of sidewalls of the control gate pattern and the floating gate pattern is reduced (or prevented) and the uncovered surfaces of the dielectric pattern are minimized.

Other example embodiments of the present inventive concepts provide a non-volatile memory device manufactured by the above manufacturing method in which the dielectric pattern is substantially covered with the floating gate pattern and the control gate pattern to thereby increase the data retention characteristics.

According to some example embodiments, there is provided a non-volatile memory device including a semiconductor substrate having a field region on which a device isolation pattern is arranged and an active region defined by the device isolation pattern and extending in a first direction, a first dielectric pattern on the active region of the substrate, a plurality of conductive stack structures arranged on the first dielectric pattern and having a recess between a pair of the stack structures adjacent to each other in a second direction substantially perpendicular to the first direction. Each of the conductive stack structures includes a floating gate electrode, a second dielectric pattern covering a surface of the floating gate electrode and the device isolation pattern in the recess and extending in the second direction, and a control gate line covering the second dielectric pattern and extending in the second direction, and a protection layer on a sidewall of the conductive stack structures to protect the sidewall of the conductive stack structures from over-etching along the first direction. The protection layer may include an etch-proof layer having an oxide and arranged on a sidewall of the floating gate electrode and a sidewall of the control gate line and a spacer layer covering the sidewall of the conductive stack structures.

In example embodiments, the etch-proof layer may be arranged on an entire sidewall of the control gate line and an upper sidewall of the floating gate electrode.

In example embodiments, the floating gate electrode and the control gate line may include polysilicon, and the second dielectric pattern may include a multi-layer pattern in which a first oxide layer, a nitride layer and a second oxide layer are sequentially stacked.

In example embodiments, the etch-proof layer may have a thickness of about 2 nm to about 3 nm and the spacer layer has a thickness of about 7 nm to about 10 nm.

In example embodiments, the etch-proof layer may include a plasma oxide layer, and the spacer layer includes a deposition oxide layer.

According to some example embodiments, there is provided a method of manufacturing a non-volatile memory device. A first dielectric pattern and a floating gate pattern may be formed on an active region of a semiconductor substrate defined by a device isolation pattern of the semiconductor substrate. The floating gate pattern may extend in a first direction and the device isolation pattern may be exposed through a recess between a pair of the floating gate patterns adjacent to each other in a second direction substantially perpendicular to the first direction. A second dielectric layer may be formed to cover the floating gate pattern and the device isolation pattern exposed through the recess. A control gate layer may be formed on the second dielectric layer to a thickness to fill up the recess. The control gate layer may be partially removed from the substrate, thereby forming a plurality of control gate lines extending in the second direction such that the second dielectric layer is exposed through a gap space between a pair of the control gate lines adjacent to each other in the first direction. A first etch-proof layer may be formed on a sidewall of the control gate line that is exposed to the gap space. The first etch-proof layer may include an oxide. The second dielectric layer and the floating gate pattern under the second dielectric layer exposed through the gap space may be removed from the substrate, thereby forming a second dielectric pattern extending in the second direction and a floating gate electrode under the second dielectric pattern by a unit of a memory cell, so that the floating gate electrode, the second dielectric pattern and the control gate line are stacked at each of the memory cells to thereby form a conductive stack structure at each cell. A spacer layer may be formed on sidewalls of the conductive stack structure.

In example embodiments, the control gate layer may be removed by repeatedly performing a first etching process, and the first etch-proof layer may be formed by repeatedly performing a second etching process. The first etching process and the second etching process may be performed alternately with each other.

In example embodiments, the control gate layer may be removed by performing a first etching process, and the first etch-proof layer may be formed by performing a first oxidation process. The first etching process may include a first step for removing an upper portion of the control gate layer until an upper surface of the second dielectric layer is exposed to thereby form an upper portion of the control gate line, and a second step for removing a lower portion of the control gate layer until the second dielectric pattern in the recess is exposed over the device isolation pattern to thereby form a lower portion of the control gate line. The first oxidation process may include a first step performed after the first step of the first etching process and forming an upper portion of the first etch-proof layer on the sidewall of the upper control line, and a second step performed after the second step of the first etching process and forming a lower portion of the first etch-proof layer on the sidewall of the lower control line in the recess.

In example embodiments, the first etching process may include a plasma etching process in which an etching rate of the control gate layer may be about 2 times to about 4 times an etching rate of the second dielectric layer and the first oxidation process includes a plasma oxidation process.

In example embodiments, the second dielectric pattern and the floating gate electrode under the second dielectric pattern may be formed by the following processing steps. The second dielectric layer and an upper portion of the floating gate pattern exposed through the gap space may be removed from the substrate by performing a second etching process, thereby forming residuals of the floating gate pattern in which an upper sidewall of the floating gate pattern is exposed through the gap space, and the residuals of the floating gate pattern may be removed from the substrate by performing a third etching process, thereby forming the floating gate electrode that is node-separated at each of the cells and exposing the first dielectric pattern in the gap space.

In example embodiments, the second etching process may include a plasma etching process in which an etching rate of the second dielectric layer is about 2 times to about 4 times an etching rate of the floating gate pattern.

In example embodiments, a second etch-proof layer may be further formed on the upper sidewall of the floating gate pattern before performing the third etching process. The second etch-proof layer may also include an oxide layer.

In example embodiments, the second etch-proof layer is formed by a second oxidation process.

In example embodiments, the third etching process may include performing a partial etching process at least two times. In such a case, additional etch-proof layers may be further formed on a lower sidewall of the floating gate pattern between the partial etching processes of the third etching process.

According to example embodiments of the present inventive concepts, the etch-proof layer may be positioned on the sidewalls of the floating gate pattern and the control gate line and thus over-etching of the sidewalls of the floating gate pattern and the control gate line along a direction of the word line in the etching processes for forming the stack gate structure, to thereby minimize the reduction of the line width of the stack gate structure. In addition, the spacer layer may be positioned on the sidewall of the stack gate structure and thus the local groove around the recess at the field region may be covered with the spacer layer, to thereby prevent the local gate shrinkage of the control gate line. Further, the impurities may be prevented from being implanted onto the sidewalls of the stack gate structure, to thereby prevent the charge trap sites on the dielectric pattern of the non-volatile memory device. Therefore, the non-volatile memory device may have more data retention characteristics due to the etch-proof layer and the spacer layer.

According to other example embodiments, a non-volatile memory device includes a device isolation pattern on a field region of a semiconductor substrate, and a first dielectric pattern on an active region of the semiconductor substrate, the active region extending a first direction. The non-volatile memory device further includes a plurality of conductive stack structures on the first dielectric pattern, wherein each of the plurality of conductive stack structures extends in a second direction substantially perpendicular to the first direction. Adjacent conductive stack structures of the plurality of conductive stack structures may be separated from each other along the second direction. A protection layer is formed on a sidewall of the plurality of conductive stack structures to protect the sidewall of the plurality of conductive stack structures along the first direction. The protection layer includes an oxide layer arranged on a sidewall of the floating gate electrode and a sidewall of the control gate line, and a spacer covering the sidewall of the plurality of conductive stack structures.

In example embodiments, each of the plurality of conductive stack structures includes a floating gate electrode, a second dielectric pattern covering a surface of the floating gate electrode and the device isolation pattern in an area between the adjacent conductive stack structures, and a control gate line covering the second dielectric pattern. The second dielectric pattern and the control gate line both extend in the second direction.

In example embodiments, a recess is between the adjacent conductive stack structures of the plurality of conductive stack structures.

According to other example embodiments, a method of manufacturing a non-volatile memory device includes forming a first dielectric pattern and a floating gate pattern on an active region of a semiconductor substrate, wherein the active layer is defined by a device isolation pattern of the semiconductor substrate. The floating gate pattern extends in a first direction. The device isolation pattern is exposed in an area between adjacent floating gates of the floating gate pattern. The adjacent floating gates extend in a second direction substantially perpendicular to the first direction. The method further includes forming a second dielectric layer to cover the floating gate pattern and the exposed device isolation pattern; and forming a control gate layer on the second dielectric layer to a thickness to fill up the area between the adjacent floating gates. The control gate layer is partially removed to form a plurality of control gate lines extending in the second direction such that the second dielectric layer is exposed through a space between adjacent control gate lines of the plurality of control gate lines in the first direction. An oxide layer is formed on a sidewall of the plurality of control gate lines that is exposed in the space between the adjacent control gate lines. The method further includes sequentially removing the second dielectric layer and the floating gate pattern under the second dielectric layer exposed through the space to form a second dielectric pattern extending in the second direction and a floating gate electrode under the second dielectric pattern by a unit of a memory cell, so that the floating gate electrode, the second dielectric pattern and the control gate line are stacked at each of the memory cells to form a conductive stack structure at each cell; and forming a spacer layer on sidewalls of the conductive stack structure.

In example embodiments, a recess is in the space between the adjacent control gate lines.

In example embodiments, the oxide layer is an etch-stop layer.

BRIEF DESCRIPTION OF THE DRAWINGS

Example embodiments will be more clearly understood from the following detailed description taken in conjunction with the accompanying drawings.

FIGS. 4A to 4I are perspective views illustrating processing steps for a method of manufacturing the non-volatile memory device shown in FIG. 2.

DETAILED DESCRIPTION OF THE EMBODIMENTS

Figure 1:
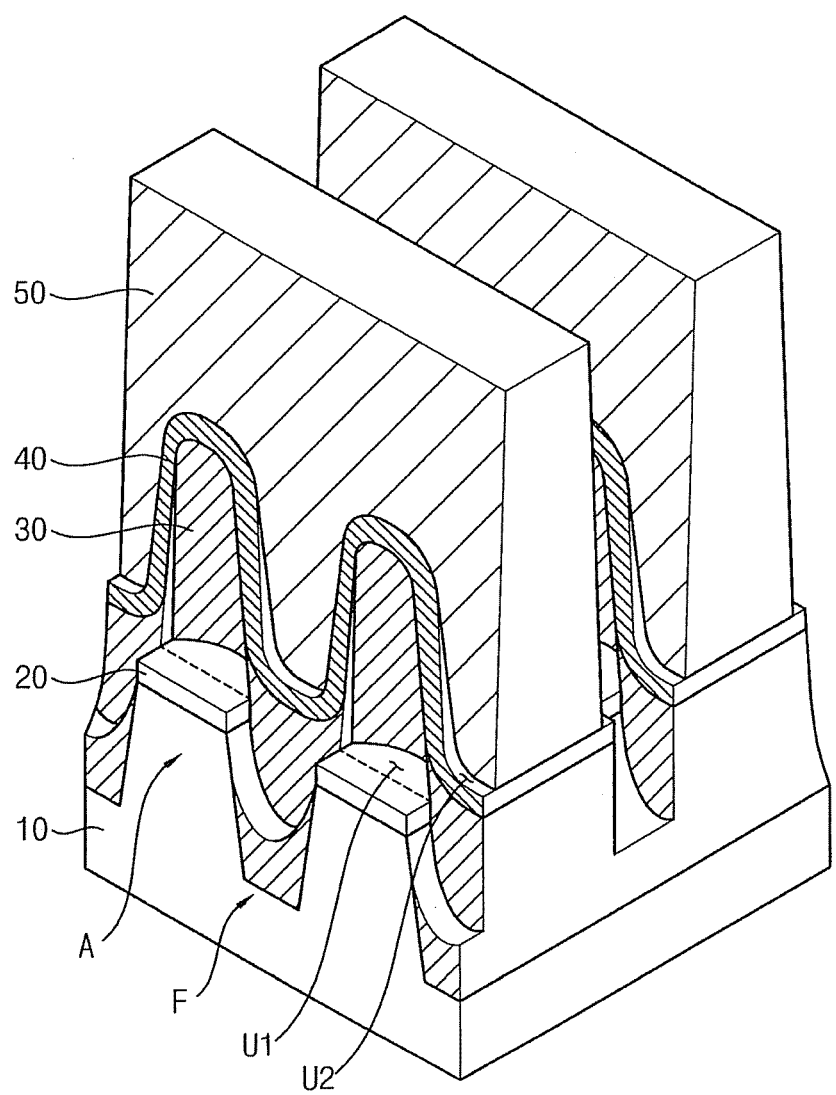
FIG. 1 is a perspective view illustrating a structure of a conventional flash memory device.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the teams "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that tent's, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Example embodiments relate to a nonvolatile memory device and a method of manufacturing the same, and more particularly, to a flash memory device and a method of manufacturing the same.

Figure 2:
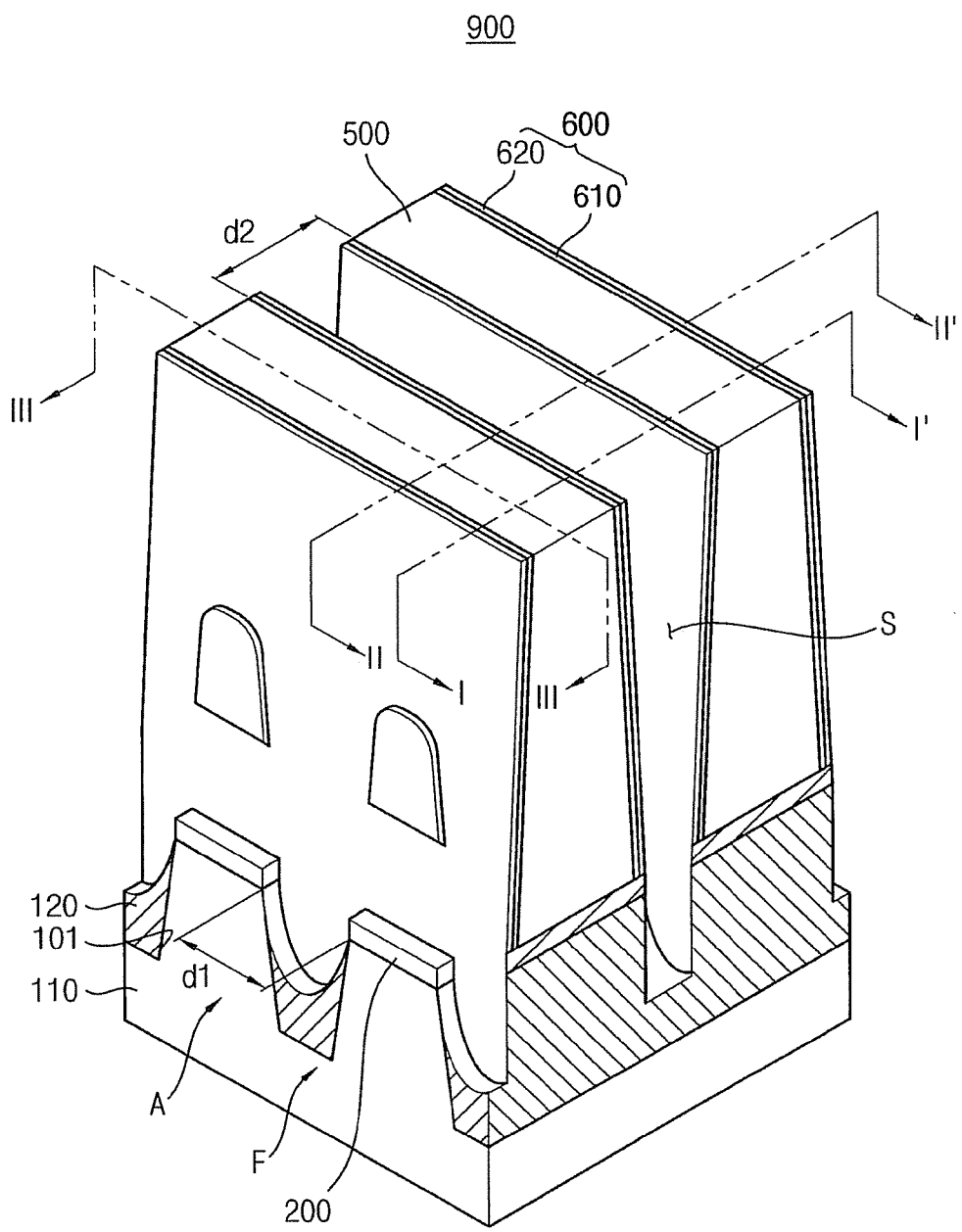
FIG. 2 is a perspective view illustrating a non-volatile memory device in accordance with example embodiments of the present inventive concepts.
Figure 3A:
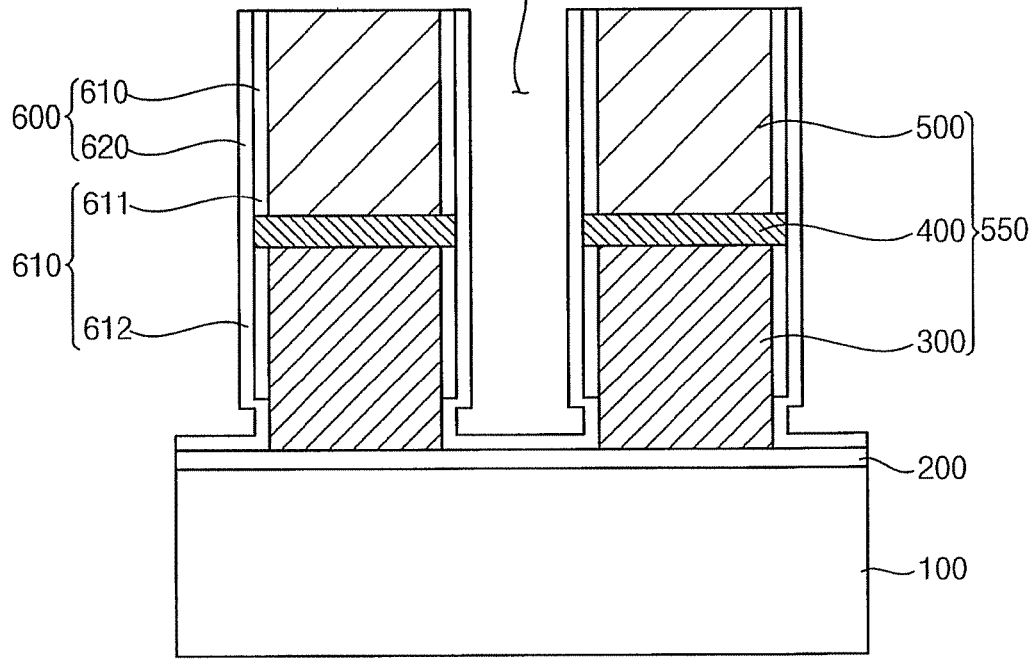
FIG. 3A is a cross-sectional view cut along a line I-I' of FIG. 1.
Figure 3B:
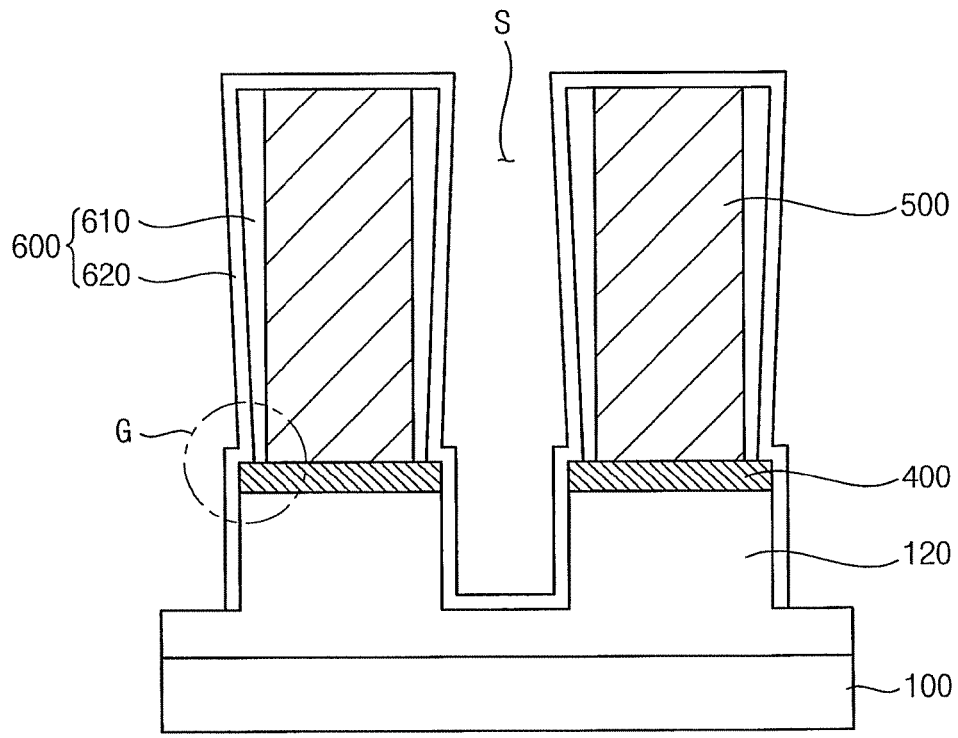
FIG. 3B is a cross-sectional view cut along a line II-II' of FIG. 1.
Figure 3C:
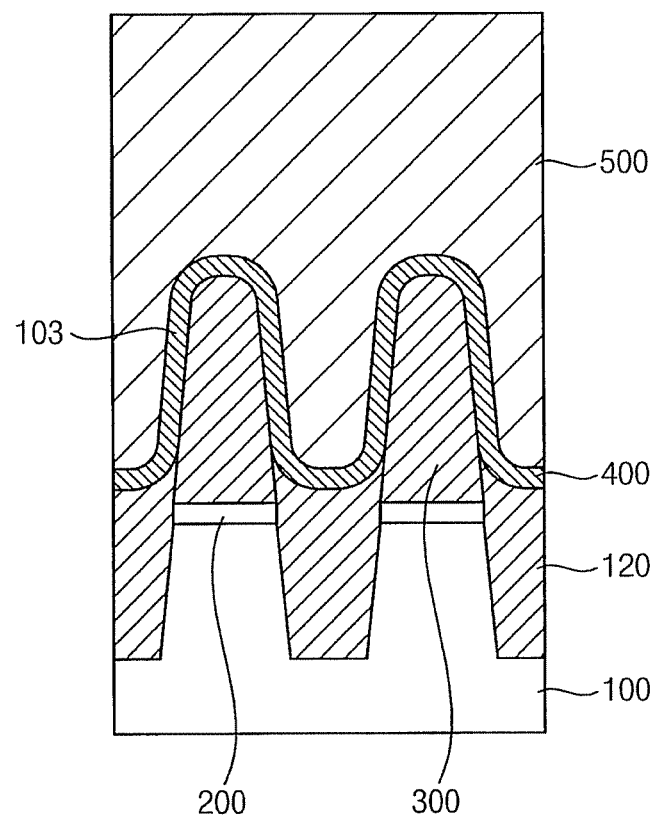
FIG. 3C is a cross-sectional view cut along a line III-III' of FIG. 1.

FIG. 2 is a perspective view illustrating a non-volatile memory device in accordance with example embodiments of the present inventive concepts. FIG. 3A is a cross-sectional view cut along a line I-I' of FIG. 1, and FIG. 3B is a cross-sectional view cut along a line II-II' of FIG. 1. FIG. 3C is a cross-sectional view cut along a line III-III' of FIG. 1.

In the present example embodiments, a NAND flash memory device may be disclosed as an example of a non-volatile memory device. However, the present non-volatile memory device may also include other memory devices (e.g., NOR flash memory devices) as would be known to one of the ordinary skill in the art.

Referring to FIGS. 2 and 3A to 3C, a non-volatile memory device 900 in accordance with example embodiments of the present inventive concepts may include a semiconductor substrate 100 (e.g., a wafer). The substrate 100 may be defined into active regions in which at least a conductive structure is positioned and field regions defining the active regions. A device isolation layer may be arranged in the field region, and thus the conductive structures may be electrically isolated from each other by the device isolation layer. For example, the substrate 100 may include single crystalline silicon.

For example, a trench 101 may be provided with each field region as a shape of line extending in a first direction, x, in such a configuration that the trenches may be spaced apart by the same distance in a second direction, y, substantially perpendicular to the first direction x. An inner oxide layer (not shown) may be further provided with inner surfaces of the trenches 101 by a thermal oxidation process.

An insulation material may be filled into the trenches 101, and the device isolation pattern 120 may be arranged in the trenches 101 in such a configuration that an upper surface is higher than a surface of the substrate 100. Thus, the device isolation pattern may be shaped into an insulation line extending in the first direction, and the insulation lines may be in parallel with and spaced apart from each other. In the present example embodiments, the trench 101 may be formed by a shallow-trench isolation (STI) process, and the device isolation pattern 120 may include silicon oxide.

Because the device isolation pattern 120 may extend in the first direction, the active region defined by the device isolation pattern 120 may also be shaped into a line extending in the first direction. A first direction pattern 200 may be arranged on the active region as a line shape extending in the first direction. The first dielectric pattern 200 may function as a tunnel isolation pattern in the non-volatile memory device 900. Because the device isolation pattern 120 may protrude from the surface of the substrate 100, an upper surface of the first dielectric pattern 200 may be lower than the upper surface of the device isolation pattern 120. For example, the first dielectric pattern 200 may comprise a material having a low dielectric constant. Examples of the material having a low dielectric constant may include silicon oxide, silicon oxide doped with fluorine (F) or carbon (C), a low-k material, etc. These may be used alone or in combinations thereof.

A floating gate electrode 300 may be positioned on the first dielectric pattern 200 by a unit of cell and the charges may be stored in the floating gate electrode 300. For example, the floating gate electrode 300 may be arranged on the first dielectric pattern 200 as a plurality of separated nodes at each cell. The separated nodes of the floating gate electrode 300 may be shaped into a line extending in the first direction x, and may be spaced apart by a second gap distance d2 in the first direction x.

The floating gate electrode 300 may be arranged alternately with the line-shaped device isolation pattern 120 in the second direction y, and thus the floating gate electrode 300 may be spaced apart by a first gap distance d1 corresponding to an upper width of the device isolation pattern 120. Thus, a recess 103 may be provided between a pair of the floating gate electrodes 300. The recess 103 may have a width of the first gap distance d1. The device isolation pattern 120 may be exposed through the recess 103. For example, the floating gate electrode 300 may include polysilicon doped with impurities, and the recess 103 may have an aspect ratio of about 1 to 3.

The second dielectric pattern 400 may be arranged on side surfaces and upper surfaces of the floating gate electrode 300. The second dielectric pattern 400 may be arranged on the device isolation pattern 120 and may be shaped into a line extending in the second direction y.

The second dielectric pattern 400 may have a high dielectric constant greater than that of silicon oxide. Examples of the material having the high dielectric constant include aluminum oxide, hafnium oxide, hafnium aluminum oxide, zirconium oxide, etc. These may be used alone or in combinations thereof. The second dielectric pattern 400 may include a multi-layer in which silicon oxide, silicon nitride and silicon oxide are sequentially stacked. In example embodiments, the second dielectric pattern 400 may include an ONO layer pattern in which a first oxide layer (not illustrated), a nitride layer (not illustrated) and a second oxide layer (not illustrated) may be sequentially stacked.

The control gate line 500 may be positioned on the second dielectric pattern 400. For example, the control gate line 500 may extend in the second direction y and may have a sufficient thickness to fill up the recess 103 between the floating gate patterns 300. Thus, the control gate line 500 may be substantially perpendicular to the device isolation pattern 120.

For example, the control gate line 500 may include a first pattern (not shown) having good gap-fill characteristics and conformal characteristics, and a second pattern (not shown) positioned on the first pattern.

The first pattern may include polysilicon doped with impurities (e.g., carbon (C), nitrogen (N), oxygen (O), phosphor (P) and born (B)), and the first pattern may be formed by a deposition process using silane (SiH4) as source gases. The first pattern may be formed conformally with the shape of the second dielectric pattern 400 having the recess 103, and thus void defects may be reduced in the recess 103. The second pattern may include materials having a high work function and low electrical resistance. The back-tunneling of charges may be sufficiently prevented from the control gate line 500 to the floating gate electrode 300 when a gate voltage is applied to the control gate line 500 for erasing data from the cell transistor. For example, the second pattern may include at least one of a metal having low electrical resistance, a metal nitride or a metal silicide. Examples of the metal having a low electrical resistance may include tantalum (Ta), titanium (Ti), tungsten (W) or similar metals. These may be used alone or in combinations thereof.

A number of the control gate lines 500 may extend in the second direction y, and may be spaced apart by the second gap distance d2 in the first direction, providing a gap space S between the neighboring control gate lines 500. The control gate line 500 may function as a word line for the non-volatile memory device 900. For a NAND flash memory device, a plurality of the control gate lines 500 may function as a word line group, and a single string selection line and a single ground selection line may be arranged at a front portion and a rear portion of the word line group. Thus, the memory block defined by the string selection line, the word line group and the ground selection line may function as a unit memory block in the NAND flash memory device.

Therefore, the second dielectric pattern 400 and the control gate line 500 may be sequentially stacked on the floating gate electrode 300 at each memory cell, to thereby the stack gate structure 550 that may be an operational unit of the non-volatile memory device 900.

A sidewall of the stack gate structure 550 may be exposed to the gap space S, and the sidewall of the stack gate structure 550 may be covered with a protection layer 600, preventing the side wall of the stack gate structure 550 from damage in a subsequent process. Hereinafter, side surfaces of the stack gate structure 550 including the sidewall of the control gate line 500 and the floating gate electrode 300 oriented in the first direction x will be referred to as "sidewall thereof." Particularly, ions may be substantially prevented from being implanted onto the sidewall of the stack gate structure in a subsequent ion implantation process by the protection layer 600. Therefore, the width of the stack gate structure 550 may be maintained regardless of the subsequent processes, and the electrical characteristics of the stack gate structure 550 may increase in spite of the subsequent ion implantation process due to the protection layer 600.

In example embodiments, the protection layer 600 may include an etch-proof layer 610 covering the sidewalls of the control gate line 500 and the floating gate electrode 300, and a spacer layer 620 on the etch-proof layer 610 to thereby cover an overall sidewall of the stacked gate structure 550.

The etch-proof layer 610 may include a first proof layer 611 covering the sidewall of the control gate line 500, and a second proof layer 612 covering an upper portion of the sidewall of the floating gate electrode 300. Thus, the second proof layer 612 may not cover a lower portion of the sidewall of the floating gate electrode 300. The etch-proof layer 610 may protect the sidewalls of the control gate line 500 and the floating gate electrode 300 from an anisotropic etching process for forming the stack gate structure 550. Thus, the sidewalls of the control gate line 500 and the floating gate electrode 300 may be prevented from being over-etched in the anisotropic etching process to thereby reducing the width loss of the control gate line 500 and the floating gate electrode 300.

For example, the first and second proof layers 611 and 612 may include an oxide layer that is formed by a plasma oxidation process, and may have a thickness of about 2 nm to about 3 nm.

The first proof layer 611 may function as a mask layer for the sidewall of the control gate line 500 in the etching process for forming the second dielectric pattern 400, and thus the sidewall of the first proof layer 611 may be coplanar with the side surface of the second dielectric pattern 400. Thus, over-etching of the sidewall of the control gate line 500 may be substantially prevented in the subsequent etching processes for forming the second dielectric pattern 400 and the floating gate electrode 300. Particularly, the lower portion of the sidewall of the control gate line 500 that may fill up the recess 103 around the device isolation layer 120 may also be prevented from being over-etched in the etching process. Thus, the second dielectric pattern 400 may be sufficiently covered with the control gate line 500 after completion of the etching process by the first proof layer 611. That is, the edge portion of an upper surface of the second dielectric pattern 400 may be prevented from being exposed in spite of the etching process around the device isolation layer 120 due to the first proof layer 611.

The second proof layer 612 may be enlarged to a portion of the sidewall of the floating gate electrode 300, and around the first dielectric pattern 200 by repetition of the etching process for forming the floating gate electrode and the plasma oxidation process for forming the second proof layer 612. Therefore, the sidewall of the floating gate electrode 300 may be prevented from being over-etched by the second proof layer 612, and thus the lower surface of the second dielectric pattern 400 may be substantially covered with the floating gate electrode 300. That is, the lower surface of the second dielectric pattern 400 may be prevented from being exposed to the gap space S.

The second proof layer 612 may be positioned on the upper portion of the sidewall of the floating gate electrode 300, and may not be positioned on the lower portion of the sidewall of the floating gate electrode 300. Thus, a stepped portion may be provided on the sidewalls of the floating gate electrode 300. The second proof layer 612 may function as a mask layer in an etching process for forming the floating gate electrode 300 by node-separating the floating gate pattern, and thus some of the lower sidewall of the floating gate pattern may be prevented from being over-etched in the etching process. The extent of the lower sidewall of the floating gate pattern may be determined by the thickness of the second proof layer 612, and thus the lower surface of the second dielectric pattern 400 may be minimally exposed by controlling the thickness of the second proof layer 612.

The etch-proof layer 610 may have local lost portions that may be partially removed during the etching process for forming the stack gate structure 550, and thus the sidewalls of the floating gate electrode 300 and the control gate line 500 may be locally exposed in spite of the etch-proof layer 610 in accordance with an initial thickness of the etch proof layer 610. When the sidewalls of the floating gate electrode 300 and the control gate line 500 are locally exposed due to the partial removal of the etch-proof layer 610, the spacer layer 620 may compensate for the local loss of the etch-proof layer 610. Thus, the spacer layer 620 may function as a supplementary etch-proof layer. In the present example embodiments, the etch-proof layer 610 may have a resultant thickness of about 2 nm to about 3 nm after the etching process for forming the stack gate structure 550 is completed.

While the etch-proof layer 610 may be positioned on the sidewalls of the floating gate electrode 300 and the control gate line 500 in some example embodiments, no etch-proof layer may also be positioned on the sidewalls of the floating gate electrode 300 and the control gate line 500 in other example embodiments due to the over-etch along the first direction in the etching process for forming the stack gate structure 550, as would be known to one of the ordinary skill in the art. In such a case, the protection layer 600 may include the spacer layer 620 without the etch-proof layer 610 (i.e., only the spacer layer 620).

Although the initial thickness of the etch-proof layer 610 may not be sufficient for the over-etching along the first direction in the etching process for forming the stack gate structure (and thus the sidewalls of the floating gate electrode 300 and the control gate line 500 may be exposed to the gate space S), the spacer layer 620 may substantially cover the sidewalls of the floating gate electrode 300 and the control gate line 500, and thus the second dielectric pattern 400 may be sufficiently covered with the floating gate electrode 300 and the control gate line 500, to thereby prevent the exposure of the surfaces of the second dielectric pattern 400.

The spacer layer 620 may be formed on entire sidewalls of the stack gate structure 550, and may function as an implantation mask for a subsequent ion implantation process. Thus, the impurities may be prevented contacting the sidewalls of the stack gate structure 550 by the spacer layer 620.

The spacer layer 620 may include an oxide layer that is formed by a CVD process. In the present example embodiments, the spacer layer 620 may include a HDPCVD oxide layer that is formed by a high density plasma CVD (HDPCVD) process. The spacer layer 620 may be arranged according to the profile of the stack gate structure 550, and thus the surfaces of the second dielectric pattern 400 may be covered with the spacer layer 620. Thus, the lower and upper surfaces of the second dielectric pattern 400 may be further prevented from being exposed, to thereby prevent the charge trap sites on the second dielectric pattern 400.

For example, the first proof layer 611 at the lower portion of the recess 103 and the lower portion of the sidewall of the floating gate electrode 300 that is not be covered with the second proof layer 612 may be partially over-etched along the first direction, and thus a local groove G may be provided around the lower portion of the recess 103 in spite of the etch-proof layer 610 depending on the initial thickness of the etch-proof layer 610.

The spacer layer 620 may have a sufficient thickness to fill up the local groove G and thus the second dielectric pattern 400 may be covered with the spacer layer 620 even when the etch-proof layer 610 may be partially removed in the etching process for forming the stack gate structure 550. In example embodiments, the spacer layer may have the thickness of about 5 nm to about 7 nm.

Accordingly, the protection layer 600 may include the etch-proof layer 610 and the spacer layer 620 on the sidewall of the stack gate structure 550, and the over-etching against the sidewalls of the floating gate pattern and the control gate line along the first direction may be substantially prevented. Thus, the second dielectric pattern 400 in the stack gate structure 500 may be substantially covered with the floating gate electrode 300 and the control gate line 500 to thereby reduce the charge trap sites thereon.

Source and drain electrodes may be positioned on the surface portions of the first dielectric pattern 200 adjacent to the stack gate structure 550 through an ion implantation process using the stack gate structure as an implantation mask, to thereby form the non-volatile memory device 900.

When performing the ion implantation process, the spacer layer 620 may function as a cell spacer for protecting the stack gate structure 550, and thus the impurities may be prevented from being implanted onto the stack gate structure 550 in the ion implantation process.

In the present non-volatile memory device, the etch-proof layer may be positioned on the sidewalls of the floating gate pattern and the control gate line, and thus the over-etching of the sidewalls of the floating gate pattern and the control gate line along a direction of the word line in the etching processes for forming the stack gate structure may be substantially prevented, to thereby minimize the reduction of the line width of the stack gate structure. In addition, the spacer layer may be positioned on the sidewall of the stack gate structure, and thus the local groove around the recess at the field region may be covered with the spacer layer, to thereby prevent the local gate shrinkage of the control gate line. Further, the impurities may be prevented from being implanted onto the sidewalls of the stack gate structure, to thereby prevent the charge trap sites on the dielectric pattern of the non-volatile memory device. Therefore, the non-volatile memory device may have increased data retention characteristics due to the etch-proof layer and the spacer layer.

Now, a method of manufacturing a non-volatile memory device according to example embodiments will be described.

FIGS. 4A to 4I are perspective views illustrating processing steps for a method of manufacturing the non-volatile memory device shown in FIG. 2.

Figure 4A:
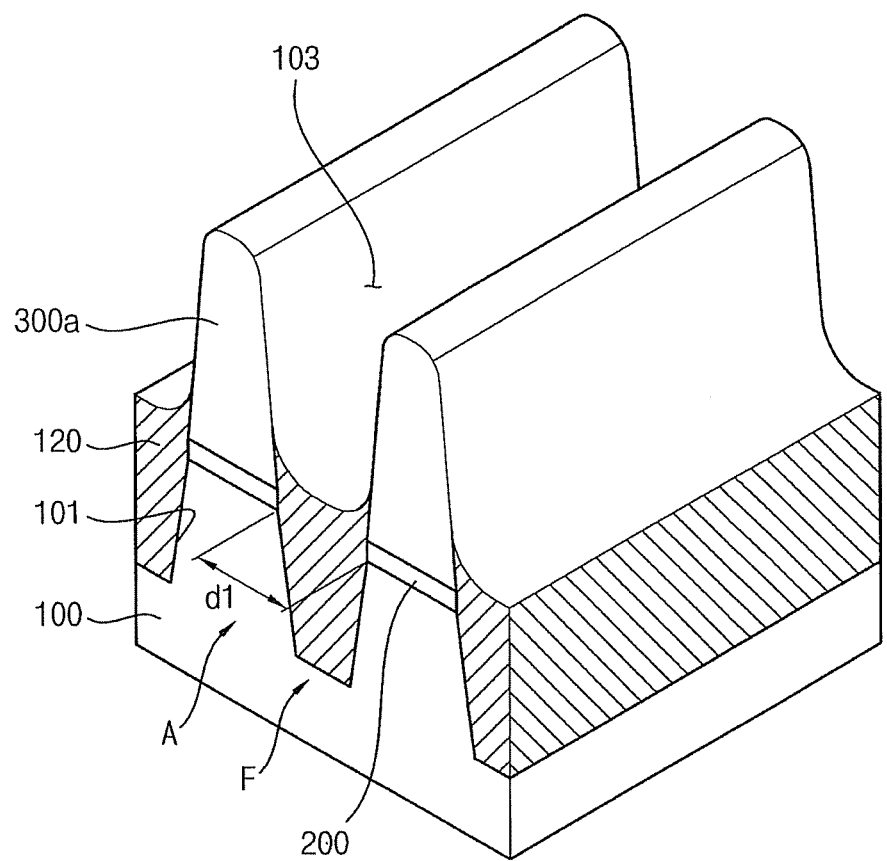

Referring to FIG. 4A, a second dielectric layer 400a (shown in FIG. 4B) may be formed on the semiconductor substrate 100 on which the first dielectric pattern 200 and the floating gate pattern 300 are formed.

In example embodiments, the substrate 100 may be divided into the active region A and the field region F, and a mask pattern (not illustrated) may be formed in such a manner that the active region A may be covered with the mask pattern and the field region F may be uncovered (or not covered) with the mask pattern. Then, the field region F of the substrate 100 may be partially removed by an etching process using the mask pattern as an etching mask, to thereby form a trench 101 extending in the first direction x. A buffer pattern (e.g., a pad oxide pattern) may be optionally formed on the active region A of the substrate 100.

The trench 101 may be filled with insulation materials to thereby form the device isolation pattern 120. For example, silicon oxide or silicon nitride may be deposited onto the substrate 100 including the mask pattern and the trench 101 to a sufficient thickness to fill up the trench 101, thereby forming a device isolation layer (not illustrated) on the substrate 100. Then, an upper portion of the device isolation layer may be planarized such that an upper surface of the device isolation layer may be coplanar with an upper surface of the mask pattern. Thus, the device isolation layer may be patterned into the device isolation pattern 120 filling up the trench 101 and a mask space (not illustrated) corresponding to a gap space of the mask pattern.

The mask pattern and the optional pad oxide pattern may be removed from the active region A of the substrate 100, thereby forming an active trench (not illustrated) through which the active region A is exposed. Thus, the active trench may be defined by the device isolation pattern 120. The mask pattern may be removed by a wet etching process using an etchant having phosphate, and the pad oxide pattern may be removed by a wet etching process using a diluted HF solution as an etchant.

The first dielectric pattern 200 may be formed on the active region A of the substrate 100 exposed through the active opening. For example, the first dielectric pattern 200 may be formed by a thermal oxidation process, and may include pure silicon oxide, silicon oxide doped with carbon (C) and boron (B) and a low-resistive material. In example embodiments, the first dielectric pattern 200 may include a tunnel oxide pattern of the flash memory device.

A floating gate layer (not illustrated) may be formed on the first dielectric pattern 200 and the device isolation pattern 120 to a sufficient thickness to fill up the active region. In example embodiments, the floating gate layer may include polysilicon doped with impurities. A polysilicon layer may be formed on the first dielectric pattern 200, and the device isolation pattern 120, by a low pressure vapor deposition process (LPCVD). The impurities may be doped into the polysilicon layer in situ with the LPCVD. Otherwise, an addition doping process (e.g., an ion implantation process) and a diffusion process may be further performed on the polysilicon layer after completion of the LPCVD process.

Then, an upper portion of the floating gate layer may be removed from the substrate 100 by a planarization process (e.g., a chemical mechanical polishing (CMP) process) until an upper surface of the device isolation pattern 120 is exposed. Thus, the floating gate layer may remain in the active opening, thereby forming a floating gate pattern 300a on the first dielectric pattern 200 in the active trench.

Therefore, the floating gate pattern 300a may be formed into a plurality of lines extending in the first direction x in parallel with the line-shaped device isolation pattern 120. That is, the pattern lines of the floating gate pattern 300a and the pattern lines of the device isolation pattern 120 may be arranged alternately with each other in the second direction y. In example embodiments, the floating gate pattern 300a may include a plurality of conductive lines that may be spaced apart by the first gap distance d1.

Thereafter, an isotropic or an anisotropic etching process may be performed against the device isolation pattern 120 and an upper portion of the device isolation pattern 120 may be partially removed from the substrate 100. Thus, an upper surface of the device isolation pattern 120 may be etched lower than that of the floating gate pattern 300a. Particularly, the etching process may be controlled in such a way that the upper surface of the device isolation pattern 120 may be higher than the an upper surface of the first dielectric pattern 200, and thus the first dielectric pattern 200 may be prevented from being damaged in the etching process for removing the device isolation pattern 120.

Therefore, the recess 103 may be formed between the conductive lines of the floating gate pattern 300a, and the device isolation pattern 120 may be exposed through the recess 103. In addition, the device isolation pattern 120 may be further removed from the substrate 100 in such a way that the floating gate pattern 300a may be protruded from the upper surface of the device isolation pattern 120 with a set height.

Figure 4B:
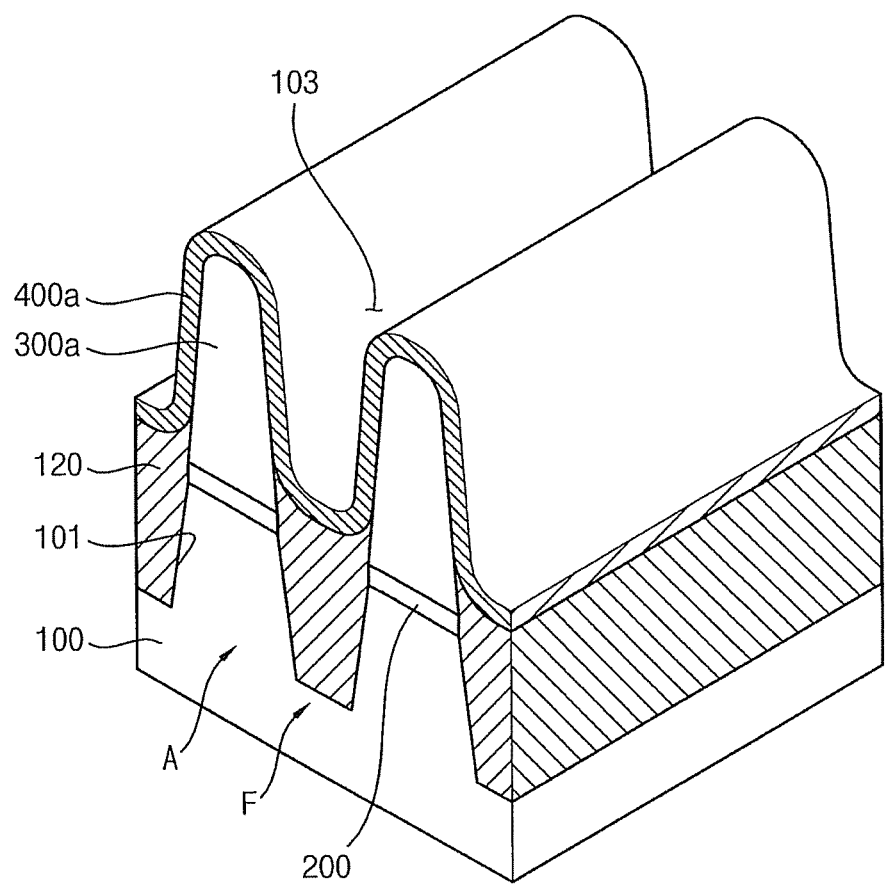

Referring to FIG. 4B, a second dielectric layer 400a may be formed on the substrate 100 along the profile of the floating gate pattern 300a and the device isolation pattern 120. Thus, the second dielectric layer 400a may be formed on the device isolation pattern 120 and on upper and side surfaces of the floating gate pattern 300a.

For example, the second dielectric layer 400a may include a multilayer wherein an oxide/nitride/oxide (ONO) layer and a material layer having a high dielectric constant are sequentially stacked. The ONO layer may be formed by an LPCVD process, and the material layer having high dielectric constant may be formed by an atomic layer deposition (ALD) process or a plasma enhanced CVD (PECVD) process.

Therefore, the second dielectric layer 400a may also be formed into a line extending in the second direction y.

Figure 4C:
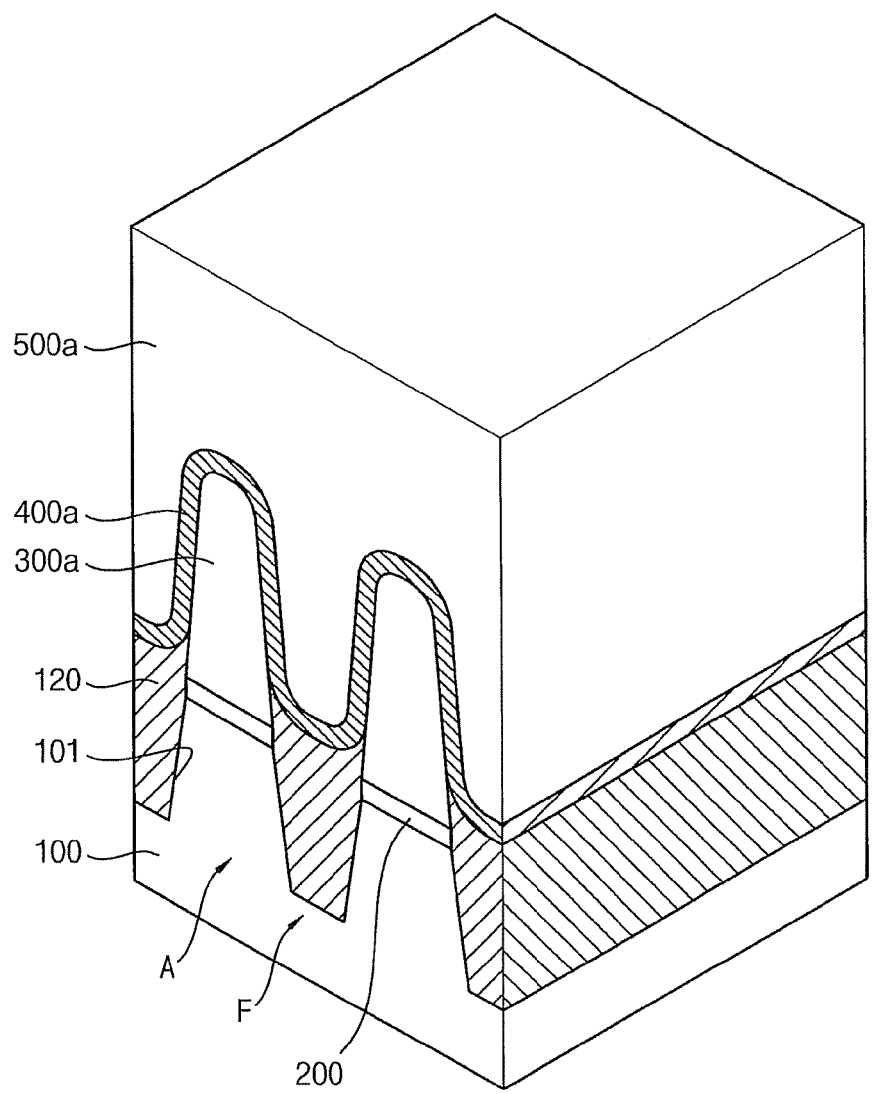

Referring to FIG. 4C, a control gate layer 500a may be formed on the second dielectric layer 400a to a sufficient thickness to fill up the recess 103. The control gate layer 500a may include a silicon layer (not illustrated) and a conductive metal layer (not illustrated) on the silicon layer. The silicon layer may have good gap-fill characteristics and conformal characteristics, and the conductive metal layer may prevent the back-tunneling of the charges. The control gate layer 500a may also include a polysilicon layer doped with impurities that may have sufficient conductivity and gap-fill characteristics.

The silicon layer may include a first silicon layer and a second silicon layer consecutively on the first silicon layer. The first silicon layer may be conformally formed on the second dielectric layer 400a with the profile of the second dielectric layer 400a, to thereby increase deposition quality of the silicon layer with respect to the second dielectric layer 400a. In contrast, the second silicon layer may include a material having good gap-fill characteristics and thus the recess 103 may be sufficiently filled with the second silicon layer without void and seam defects.

The first and second silicon layers may be formed the second dielectric layer 400a by first and second CVD processes using first and second source gases. For example, the CVD process may include an LPCVD process and a PECVD process. The first CVD process may be performed at a relatively low rate using the first source gases, to thereby more accurately control the CVD process. Examples of the first source gases may include disilane ($Si_2H_6$), trisilane ($Si_3H_8$) and a mixture thereof. In contrast, the second CVD process may be performed at a relatively high rate using the second source gases, to thereby increase process efficiency. Examples of the second source gases may include silane ($SiH_4$).

Thereafter, a doping process (e.g., an ion implantation process) and a diffusion process may be further performed on the silicon layer, to thereby form a polysilicon layer doped with impurities. Example of the impurities may include carbon (C), nitrogen (N), oxygen (O), phosphor (P), boron (B) or similar impurities. Accordingly, the polysilicon layer having sufficient conductivity may be formed on the second dielectric layer 400a in such a manner that the recess 103 may be filled up with the polysilicon layer without any void and seam defects.

The conductive metal layer may include materials having high work function and low electrical resistance, and a metal nitride. Examples of the metal having low electrical resistance may include tantalum (Ta), titanium (Ti), tungsten (W) or similar metals. These may be used alone or in combinations thereof. The metal nitride may include a nitride of the above low-resistive metals.

Figure 4D:
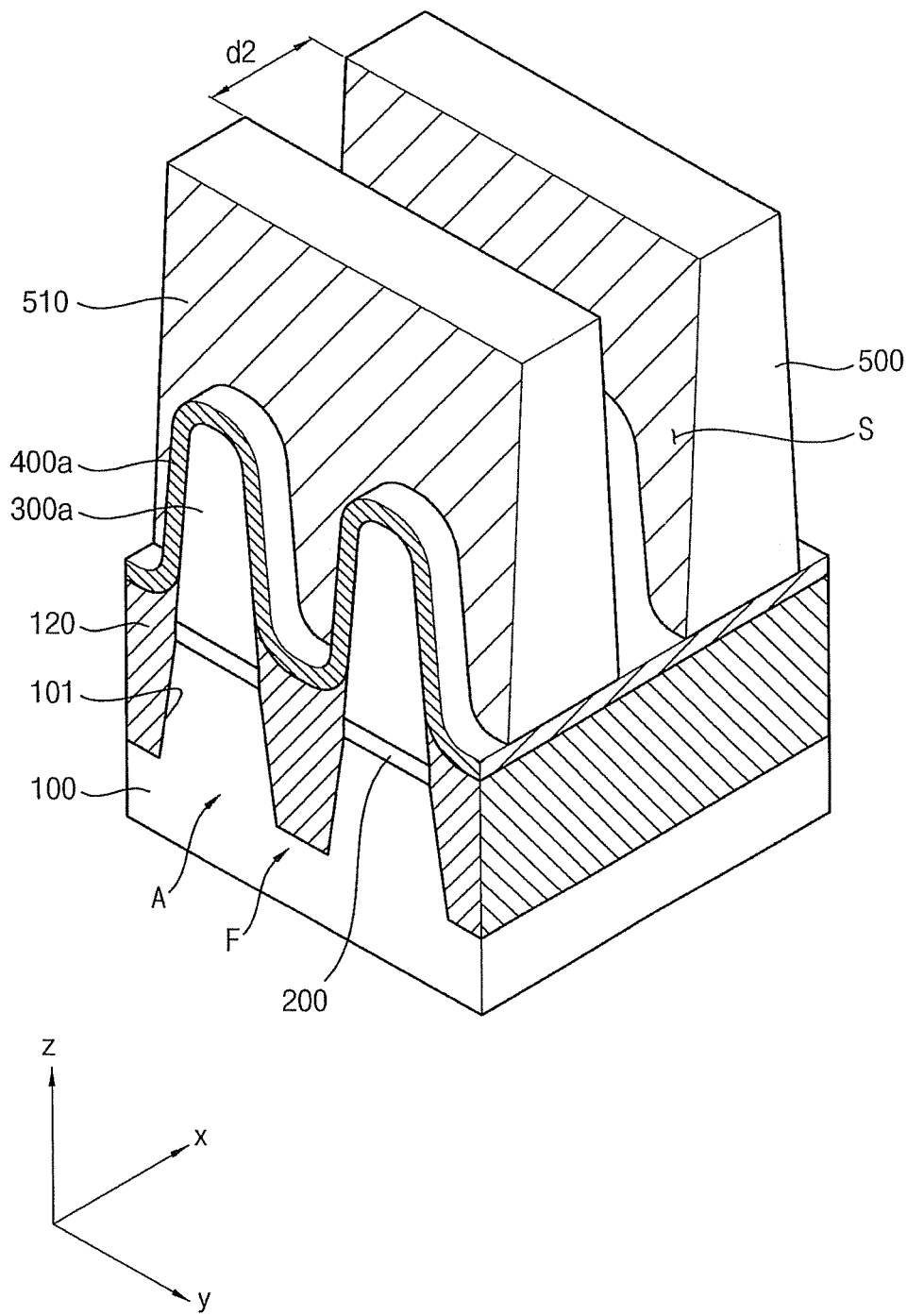

Referring to FIG. 4D, the control gate layer 500a may be partially etched off, forming the control gate line 500 extending in the second direction y. The gap space S may be provided between the neighboring control gate lines 500, and the second dielectric layer 400a may be exposed through the gap space S.

For example, a mask pattern (not illustrated) may be formed on the control gate layer 500a, and the first etching process may be performed on the control gate layer 500a using the mask pattern as an etching mask, to thereby form the control gate line 500 extending in the second direction y substantially perpendicular to the first direction x. The first etching process may include a dry etching process using an etching gas having etching selectivity with respect to the second dielectric layer 400a.

In example embodiments, the etching gas for the first etching process may have etching selectivity of about 2 to 4 with respect to the second dielectric layer 400a. However, the etching selectivity of the etching gas may vary in accordance with the aspect ratio of the recess 103.

Accordingly, the control gate line 500 may be formed into a plurality of lines that may be spaced apart by the second gap distance d2 to thereby generate the gap space S and may extend in the second direction y. Thus, the side wall of the control gate line 500, and the second dielectric layer 400a may be exposed through the gap space S.

Figure 4E:
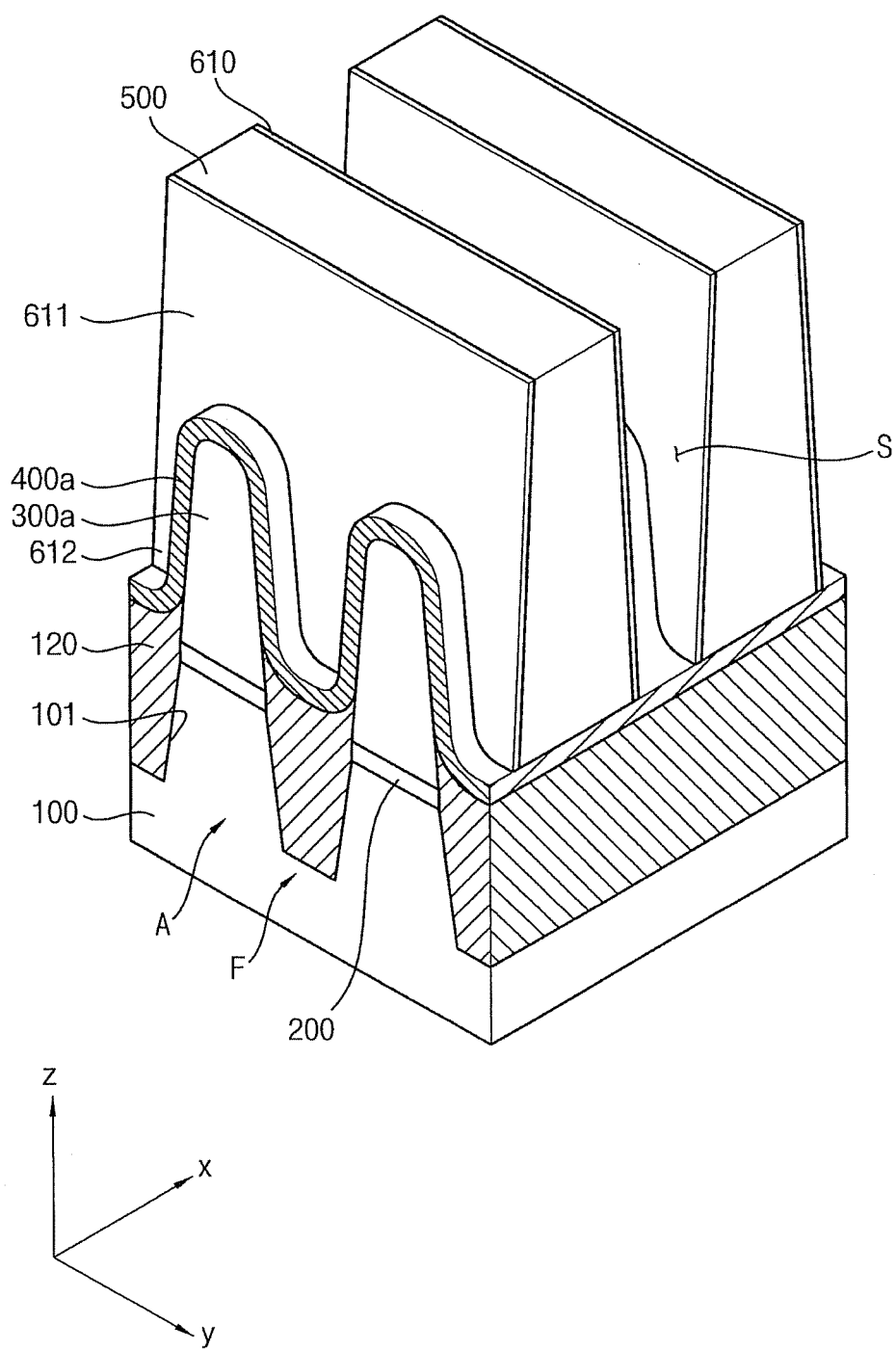

Referring to FIG. 4E, the first proof layer 611 of the etch-proof layer 610 may be formed on the sidewall 510 of the control gate line 500.

For example, the substrate 100 on which the control gate line 500 may be formed may be loaded into a process chamber, and a first plasma process may be performed on the control gate line 500 in an atmosphere of oxygen. Thus, a thin oxide layer may be formed on the sidewall 510 of the first control gate line 500 exposed to the gap space S, to thereby form the first proof layer 611 on the sidewall 510 of the control gate line 500. When the control gate line 500 includes polysilicon, the first proof layer 611 may include silicon oxide.

The first proof layer 611 may be formed on an entire surface of the sidewall 510 of the control gate line 500 to a sufficient thickness to protect the sidewall 510 of the control gate line 500 in a subsequent etching process. The thickness of the first proof layer 611 may vary in accordance with the second gap distance d2 and the aspect ratio of the recess 103. In example embodiments, the first proof layer 611 may have the thickness of about 2 nm to about 3 nm after completion of the subsequent etching process.

Because the second dielectric layer 400a may include an oxide or a metal oxide, an additional oxide layer may not be formed on the second dielectric layer 400a in the first plasma oxidation process.

The first etching process may only be performed once to remove the control gate layer 500a filling up the recess 103, and thus the second dielectric layer 400a in the recess 103 may be substantially exposed through the gap space S by performing the first etching process once. In such a case, the first proof layer 611 may be formed on the entire surface of the sidewall 510 of the control gate line 500 by the single performance of the first plasma oxidation process.

However, the first etching process and the first plasma oxidation process may be alternately repeated, and thus the control gate line 500 and the first proof layer 611 may be alternately formed by performing the first etching process and the first plasma oxidation process several times. For example, the first etching process and the first plasma oxidation process may be performed through two steps, respectively, and each step of the first etching process may be performed alternately with each step of the first plasma oxidation process.

Particularly, a first step of the first etching process may be performed on the control gate layer 500a, and thus an upper portion of the control gate layer 500a may be removed from the second dielectric layer 400a until a topmost surface of the second dielectric layer is exposed. Therefore, an upper portion of the control gate line 500 may be formed on the substrate 100 by the first step of the first etching process. Then, a first step of the first plasma oxidation process may be performed on an upper sidewall of the upper portion of the control gate line 550, and thus an upper portion of the first proof layer 611 may be formed on the upper sidewall of the upper portion of the control gate line 500. Then, a second step of the first etching process may be performed on the residual control gate layer 500a, and thus a lower portion of the control gate layer 500a which fills up the recess 103 may be removed from the second dielectric layer 400a until the surface of the second dielectric layer 400a may be exposed in the recess 103. Therefore, a lower portion of the control gate line 500 may be formed on the substrate 100 by the second step of the first etching process. A second step of the first plasma oxidation process may be performed on a lower sidewall of the lower portion of the control gate line 550, and thus a lower portion of the first proof layer 611 may be formed on the lower sidewall of the lower portion of the control gate line 500 in the recess 103.

When the second step of the first etching process is performed, the upper portion of the first proof layer 611 may prevent the upper sidewall of the upper portion of the control gate line 500 from being over-etched. That is, when the lower portion of the control gate layer 500*a* is removed from the second dielectric layer 400*a* in the recess 103 by the second step of the first etching process, the upper sidewall of the upper portion of the control gate line 500 may be sufficiently prevented from being over-etched in the second step of the first etching process.

Figure 4F:
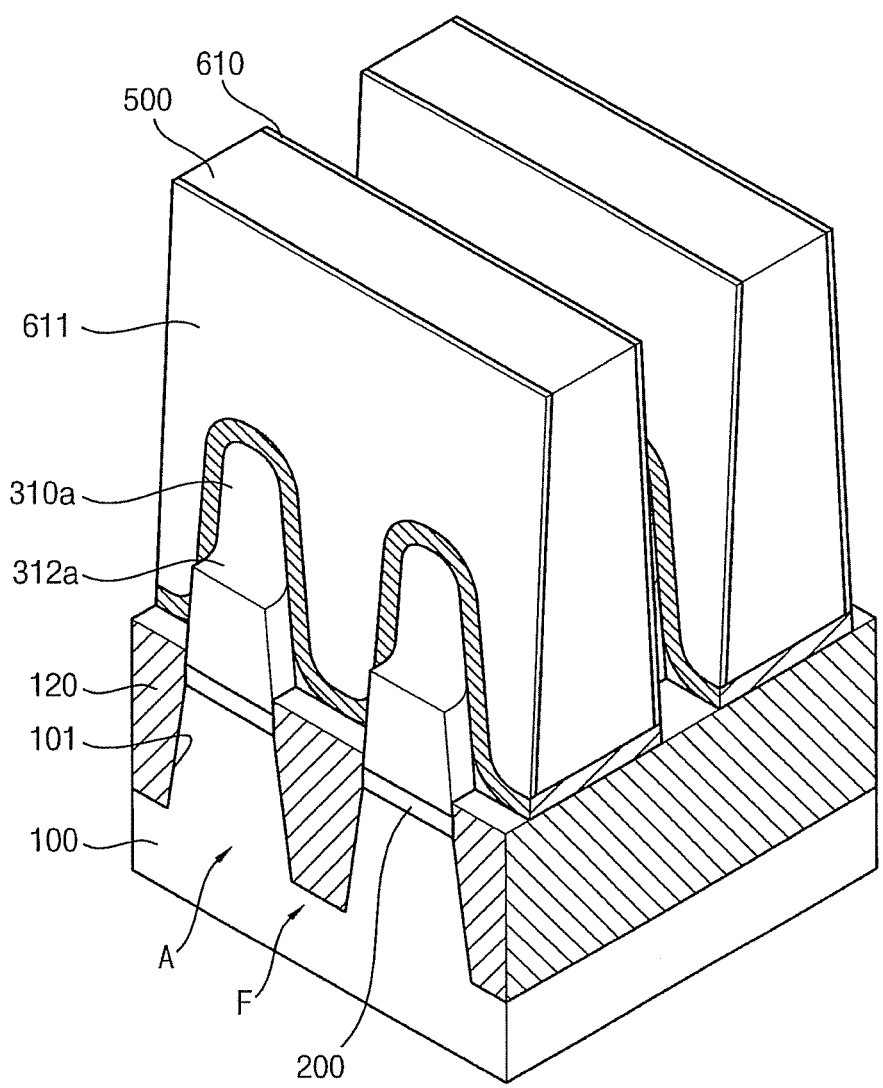

Referring to FIG. 4F, the second etching process may be performed on the substrate 100 using the same mask pattern as an etching mask, and thus the second dielectric layer 400*a* exposed through the gap space S may be removed from the floating gate pattern 300*a*.

For example, the second etching process may include a plasma etching process which is a type of an anisotropic etching process, and the second etching process may be performed through a first etching step for removing the second dielectric layer 400*a* from upper surfaces of the floating gate pattern 300*a* and a second etching step for removing the second dielectric layer 400*a* from side surfaces of the floating gate pattern 300*a* in the recess 103.

Particularly, the plasma of the etching gases for the first step of the second etching process may be supplied into the gap space S, and thus the second dielectric layer 400*a* may be removed from the substrate until the upper surface of the floating gate pattern 300*a* is exposed. Thus, the second dielectric layer 400*a* may be separated by the floating gate pattern 300*a* in the gap space S and may remain on the side surface of the floating gate pattern 300*a* in the recess 103. Accordingly, an uppermost surface of the floating gate pattern 300*a* may be coplanar with an upper surface of the separated second dielectric layer 400*a*.

Most of the plasma etching process may be performed anisotropically, and some of the plasma etching process may be performed isotropically in the first step of the second etching process. Thus, the control gate line 500 may also be attacked (or exposed to plasma) by the isotropic plasma etching process. However, the first proof layer 611 may prevent the sidewall of the control gate line 500 from being etched off by the plasma etching process, and thus the line width of the control gate line 500 may be sufficiently prevented from being reduced in the first direction x. That is, the line width of the control gate line 500 may be maintained in the second etching process.

Then, the second step of the second etching process may be consecutively performed by using the same plasma, and thus the separated second dielectric layer 400*a* may be removed from side surfaces of the floating gate pattern 300*a* in the recess 103 as well as the exposed floating gate pattern 300*a*. That is, both of the floating gate pattern 300*a* and the second dielectric layer 400*a* may be removed from the substrate in the second step of the second etching process.

In such a case, the second etching process may be controlled in such a manner that the etching rate of the second dielectric layer 400*a* may be about two to four times the etching rate of the floating gate pattern 300*a*. Thus, most of the second dielectric pattern 400*a* may be removed from the floating gate pattern 300*a* in the recess 103 while an upper portion of the floating gate pattern 300*a* may be removed from the substrate 100 in the second step of the second etching process.

Accordingly, the dielectric pattern 400*a* in the gap space S may be removed from the floating gate pattern 300*a* by the first and the second steps of the second etching process, and may remain under the control gate line 500. That is, the second dielectric layer 400*a* may be formed into a line extending in the second direction y along with the control gate line 500, to thereby form the second dielectric pattern 400. In contrast, the floating gate pattern 300*a* may be partially removed from the substrate 100 by the second etching process, and thus side walls 310*a* and front surfaces 312*a* of the floating gate pattern 300*a* may be exposed through the gap space S.

Figure 4G:
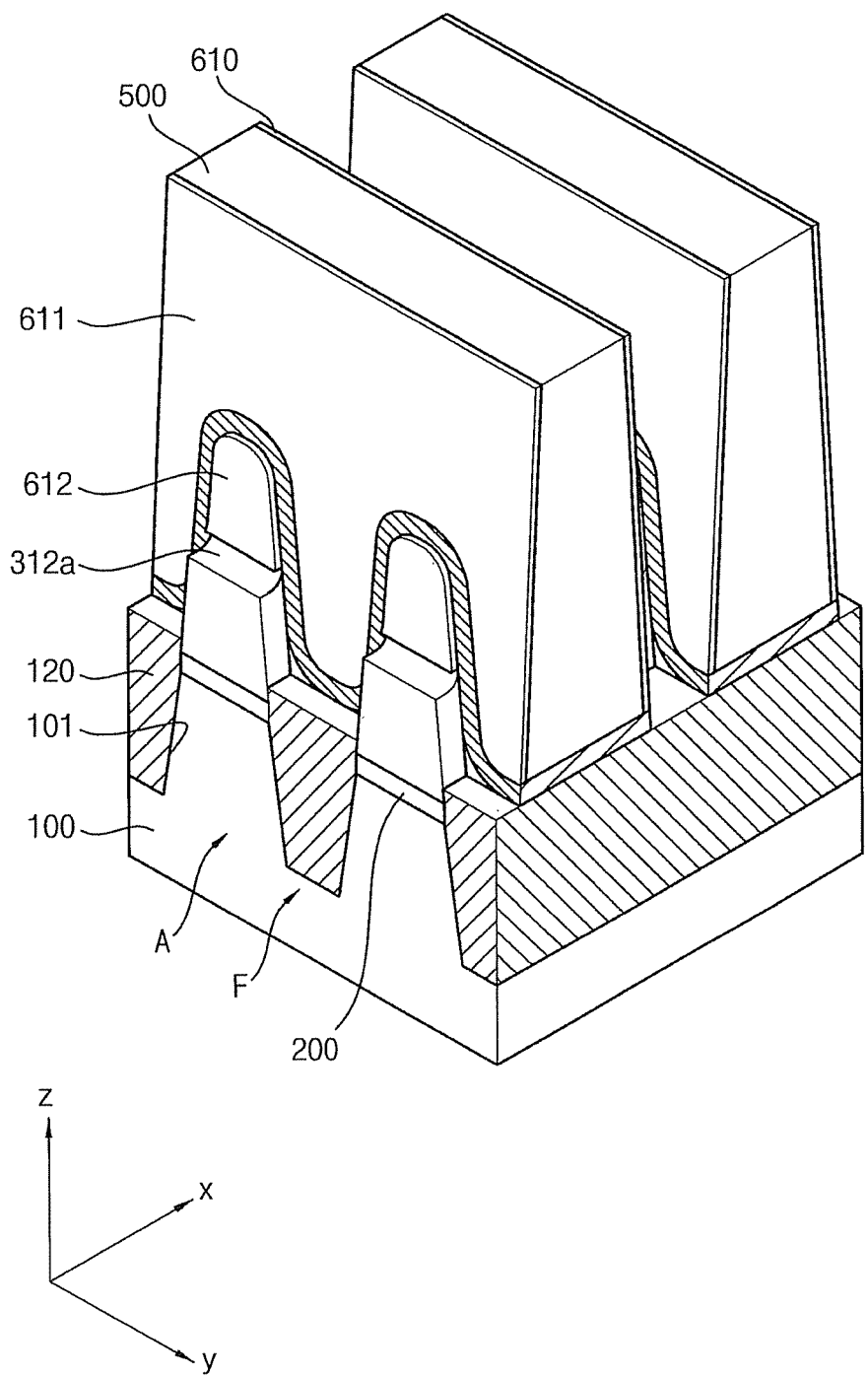

Referring to FIG. 4G, the second proof layer 612 may be formed on the side walls 310*a* and front surfaces 312*a* of the floating gate pattern 300*a*.

For example, the substrate 100 including the exposed side walls 310*a* and the front surfaces 312*a* of the floating gate pattern 300*a* may be loaded into a process chamber, and a second plasma oxidation process may be performed on the substrate 100, to thereby form the second proof layer 612. When the floating gate pattern 300*a* includes polysilicon, the second proof layer 612 may include silicon oxide.

Similar to the first proof layer 611, the second proof layer 612 may prevent the sidewall 310*a* of the floating gate pattern 300*a* from being over-etched in a subsequent third etching process.

The second proof layer 612 may be formed on the sidewall of the floating gate pattern 300*a* to a sufficient thickness to protect the floating gate pattern 300*a* from the third etching process. The thickness of the second proof layer 612 may be determined by the second gap distance d2, and the height of the residual floating gate pattern 300*a* in the gap space S. For example, the second proof layer 612 may have the thickness of about 2 nm to 3 nm when the third etching process is completed.

An oxide layer on the front surface 312*a* of the floating gate pattern 300*a*, which may be formed in the second plasma oxidation process for forming the second proof layer 612, may be removed from the floating gate pattern 300*a*, and thus the residuals of floating gate pattern 300*a* may be efficiently removed from the substrate 100 in the third etching process. For example, the second plasma oxidation process may be formed after masking the front surface 312*a* of the floating gate pattern 300*a*, and thus no oxide layer may be formed on the front surface 312*a* of the residuals of the floating gate pattern 300*a*. Otherwise, the oxide layer may be removed from the front surface 312*a* of the residuals of the floating gate pattern 300*a* by an additional process. Because the second dielectric layer may include an oxide or a metal oxide, an additional oxide layer may not be formed on the second dielectric layer 400*a* by the second plasma oxidation process.

Figure 4H:
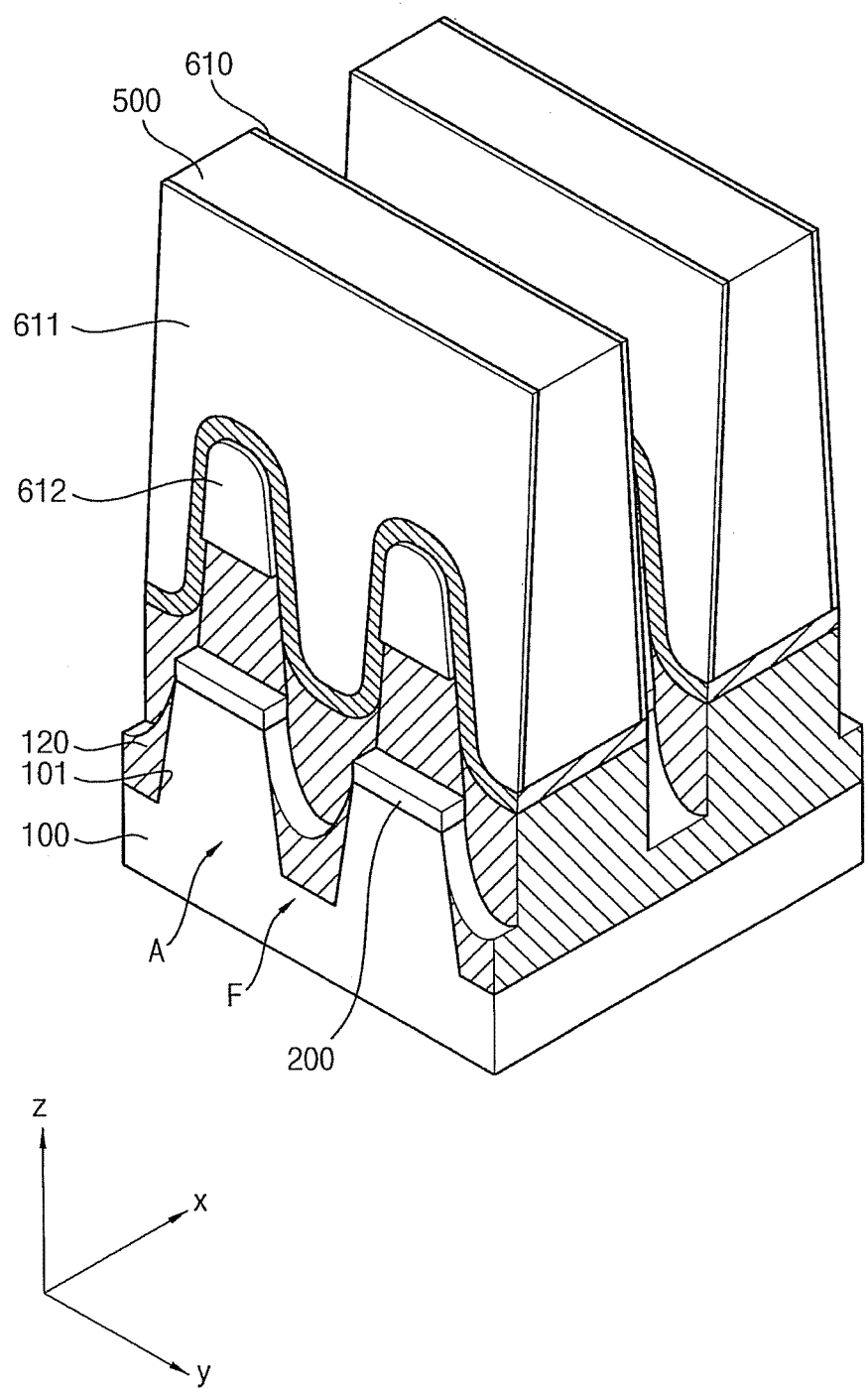
Figure 41:
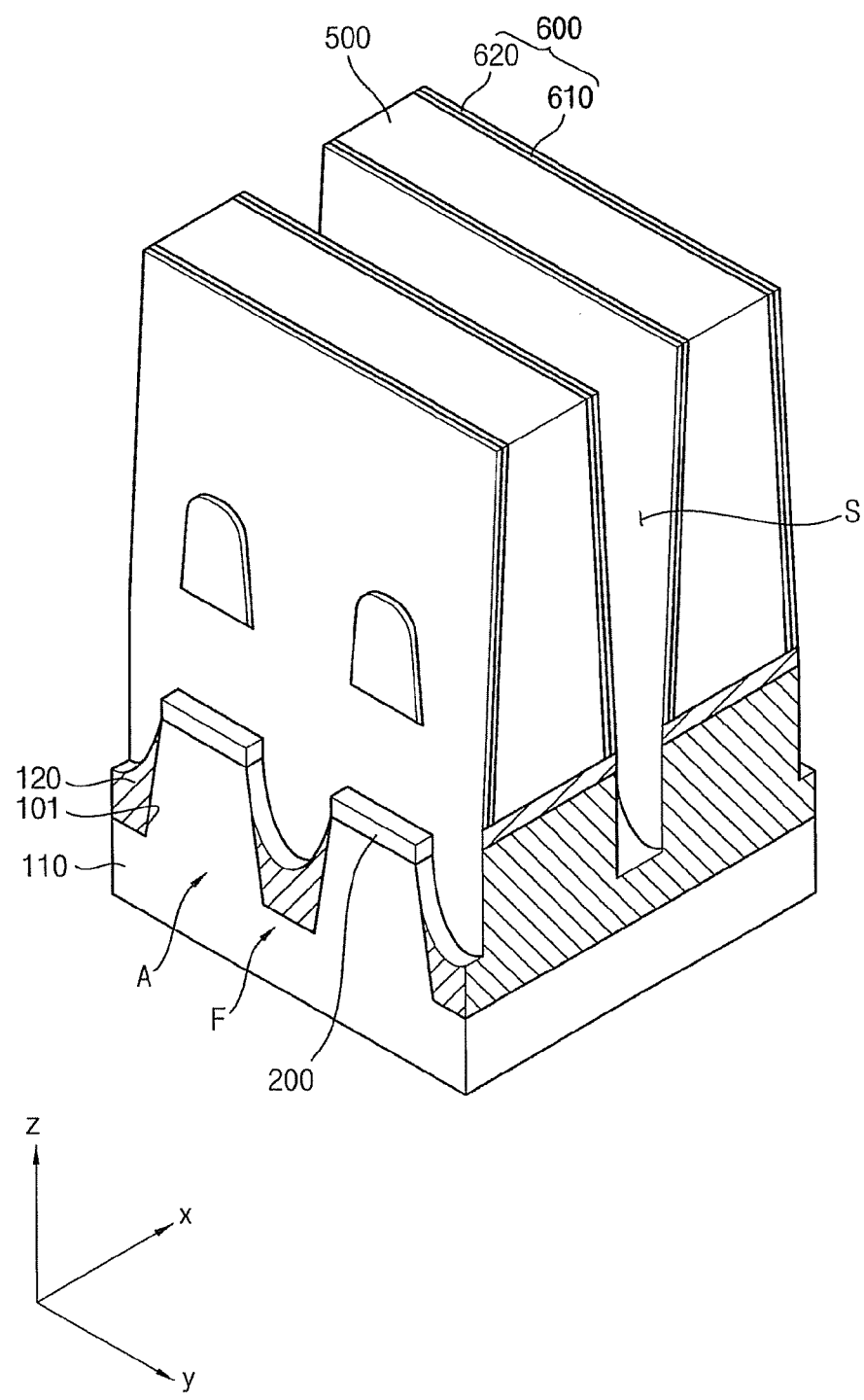

Referring to FIG. 4H, the third etching process may be performed on the substrate 100 and the residuals of the floating gate pattern 300*a* in the recess 103*a* may be removed from the substrate 100.

The third etching process may also include an anisotropic etching process (e.g., a plasma dry etching process). When the control gate line 500 and the floating gate pattern 300*a* include the same materials, the third etching process may be substantially the same as the first etching process.

Therefore, an upper sidewall 310*a* of the floating gate pattern 300*a* may be covered with the second proof layer 612, and a lower sidewall of the floating gate pattern 300*a* may be exposed to the gap space S. In addition, the floating gate pattern 310*a* exposed through gap space S may be removed from the substrate 100, and thus the floating gate pattern 300*a* may be node-separated by the unit of the cell in the first direction x, thereby form the floating gate electrode 300 arranged in the first direction x.

Thus, the floating gate electrode 300, the second dielectric pattern 400 and the control gate line 500 may be sequentially staked at each cell on the substrate 100, to thereby form the stack gate structure 550 on the substrate 100. In contrast, the first dielectric pattern 200 adjacent to the stack gate structure 550 in the field region F of the substrate 100 may be exposed through the gap space S.

Because the lower sidewall of the floating gate pattern 300a is not covered with the second proof layer 612, the lower sidewall of the floating gate pattern 300a may be over-etched by the third etching process. However, the second proof layer 612 on the upper sidewall 310a of the floating gate pattern 300a may function as a mask layer to some degree, and thus some of the lower sidewall of the floating gate pattern 300a may be prevented from being over-etched due to the second proof layer 612 in the third etching process according to the thickness of the second proof layer 612. Therefore, the lower surfaces of the second dielectric pattern 400a may also be prevented from being exposed due to the reduction of the over-etching against the lower sidewall of the floating gate pattern 300a.

Although not illustrated in figures, the third etching process may also be performed through a number of steps. Some portion of the lower sidewall of the floating gate pattern 300a may be exposed by each step of the third etching process, and an additional proof layer (not illustrated) may be formed on the exposed lower sidewall of the floating gate pattern 300a. That is, the alternate repetition of the third etching process and the additional plasma oxidation process may enlarge the surface of the second proof layer 612 on the floating gate electrode 300. Accordingly, the over-etching against the lower sidewall of the floating gate pattern 300a may be reduced in the third etching process for forming the floating gate electrode 300.

Accordingly, the over-etching against the sidewalls of the control gate line and the floating gate pattern along the first direction x due to the charge deflection in the plasma etching process may be substantially prevented by the first and the second proof layers 611 and 612. That is, the sidewalls of the floating gate pattern 300a and the control gate line 500 may be sufficiently prevented from being over-etched in the first, second and third etching process for forming the stack gate structure 550 by the etch-proof layer 610, and thus the line width of the stack gate structure 550 may be reduced. In addition, exposure of the upper and lower surfaces of the second dielectric pattern 400 may be substantially prevented around the sidewalls of the floating gate electrode 300 and the control gate line 500.

Example embodiments disclose that the etch-proof layer 610 may include the first proof layers 611 on the sidewall of the control gate line 500, and the second proof layer 612 on the floating gate electrode 300. However, the etch-proof layer 610 may include one of the first and the second proof layers 611 and 612 in accordance with device requirements and process conditions of the non-volatile memory device 900.

Referring FIG. 4I, the spacer layer 620 may be formed on a sidewall of the stack gate structure 550 including the etch-proof layer 610.

For example, the spacer layer 620 may be formed on the etch-proof layer 610 and the exposed side surface of the second dielectric pattern 400. Thus, the sidewalls of the stack gate structure 550 exposed to the gap space S may be covered with the spacer layer 620. Therefore, impurities may be prevented from being implanted onto the sidewalls of the stack gate structure 550 in a subsequent ion implantation process. Particularly, the spacer layer 620 may compensate for the partial loss of the etch-proof layer 610 due to the first, second and third etching processes for forming the stack gate structure 550. The first, second and third etching processes may cause damage to the first and the second proof layers 611 and 612 in the formation process of the stack gate structure 550, and thus the first and the second proof layers 611 and 612 may be partially etched off from the sidewalls of the floating gate pattern 300a and the control gate line 500. Thus, the first and the second proof layers 611 and 612 may have an unexpectedly reduced thickness, or may be partially removed from the sidewalls in such a manner that the sidewalls of the floating gate pattern 300a and the control gate line 500 may be partially exposed. The spacer layer 620 may compensate for the partial loss of the first and the second proof layers 611 and 612, and may function as a supplemental proof layer to the sidewalls of the floating gate pattern 300a and the control gate line 500. Accordingly, the impurities may be substantially prevented from being implanted onto the stack gate structure 550 due to the spacer layer 620, to thereby prevent the charge trap sites on the second dielectric pattern 400.

In example embodiments, the spacer layer 620 may have a thickness of about 7 nm to about 10 nm from the sidewalls of stack gate structure 550. However, the thickness of the spacer layer 620 may vary in accordance with the second gap distance d2, as would be known to one of the ordinary skill in the art.

For example, the spacer layer 620 may be formed by a high density plasma CVD (HDPCVD) process or a plasma enhanced CVD (PECVD) process using gases including oxygen (O) as source gases.

Thereafter, the impurities may be implanted onto the surface portions of the first dielectric pattern 200 exposed through the gap space S by an ion implantation process, to thereby form the source and drain electrodes of the non-volatile memory device 900.

The spacer layer 620 may function as a substrate protection layer for protecting the substrate 100 from the ion implantation process. Thus, no additional substrate protection layer may be formed on the substrate 100 in advance before the ion implantation process, to thereby reduce the process time of the manufacturing process for the non-volatile memory device 900. Accordingly, when the thickness of the spacer layer 620 may be greater than that of the substrate protection layer, the substrate protection layer needs not be formed before the ion implantation process.

According to the method of manufacturing non-volatile memory devices, the etch-proof layer on the sidewalls of the floating gate pattern and the control gate line may sufficiently prevent the over-etching against the sidewalls thereof in a direction of the word line of the non-volatile memory device in the etching processes for forming the stack gate structure, to thereby minimize the reduction of the line width of the stack gate structure. In addition, the spacer layer on the sidewall of the stack gate structure may prevent the impurities from being implanted onto the sidewalls of the stack gate structure, to thereby prevent the charge trap sites on the dielectric pattern of the non-volatile memory device. Therefore, the non-volatile memory device may have increased data retention characteristics due to the etch-proof layer and the spacer layer.

Now, a memory system including a non-volatile memory device will be described.

Figure 5:
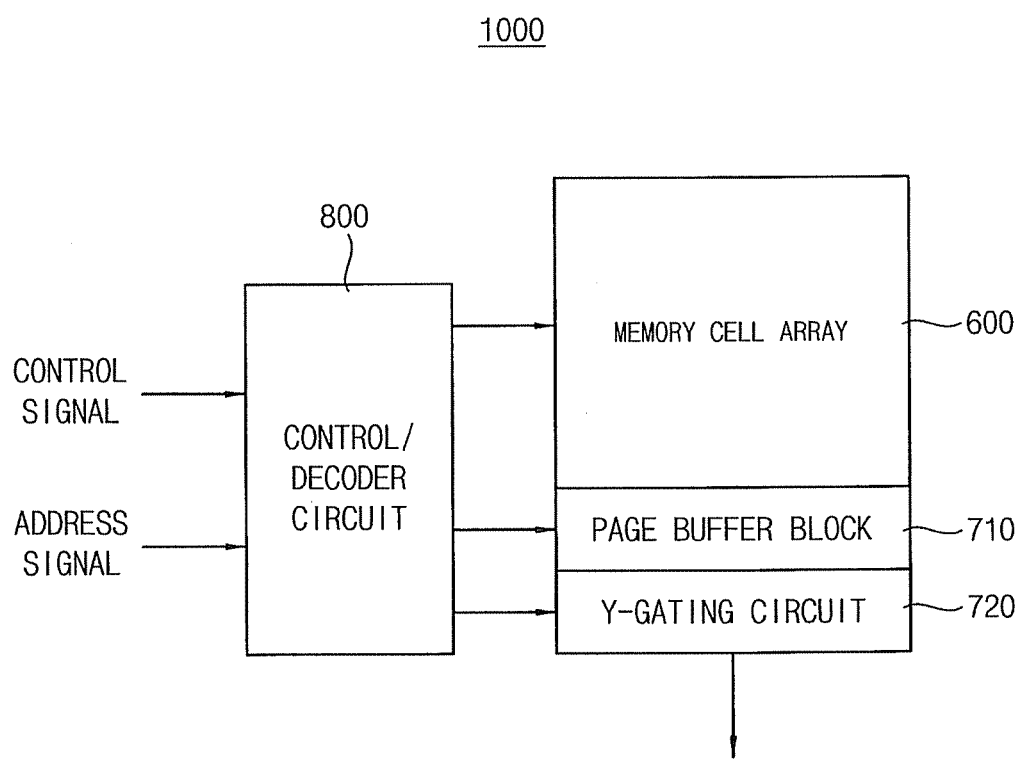
FIG. 5 is a view illustrating a memory system having the non-volatile memory device shown in FIG. 2 in accordance with example embodiments of the present inventive concepts.

FIG. 5 is a view illustrating a memory system having the non-volatile memory device shown in FIG. 2 in accordance with example embodiments of the present inventive concepts.

An NAND flash memory system having an NAND memory device may be provided as a memory system. However, it should be understood that an NAND flash memory system is merely illustrative of example embodiments and is not to be construed as limiting thereof. For example, example embodiments of the present inventive concepts may also be applied to a NOR flash memory system having a NOR memory device and other non-volatile memory systems known to those skilled in the art without materially departing from the novel teachings and advantages of the present invention.

Referring to FIG. 5, the memory system 1000 according to example embodiments of the present inventive concepts may include a memory cell array 600 on which a plurality of memory cells for storing data may be arranged, a page buffer block 710 and a Y-gating circuit 720 for controlling the memory cells in the memory cell array 600, and a control/decoder circuit 800 for electrically operating the memory cell array 600, the page buffer block 710, and the Y-gating circuit 720. The control/decoder circuit 800 may generate various control signals and address signals in response to external signals. The generated control signals and address signals may be applied to the memory cell array 600, the page buffer block 710, and the Y-gating circuit 720 by the control/decoder circuit 800.

The memory cells in the memory cell array 600 may have the same structure as described with reference to FIG. 2. The electronic information and data may be stored to the memory cells in the memory cell array 910.

For example, the memory cell array 600 may include a plurality of memory blocks, and each of the memory blocks may include a plurality of bit lines and a plurality of cell strings electrically connected to one of the bit lines. Each of the cell strings may include a string selection transistor connected to the bit line, a ground selection transistor connected to a common source line, and a plurality of memory cells connected in series between the string selection transistor and the ground selection transistor. Each of the memory cells may include the non-volatile memory device shown in FIG. 2. Each of the bit lines may be connected to a page buffer in the page buffer block 710.

Each of the page buffers in the page buffer block 710 may be operated by the operation signals transferred from the control/decoder circuit 600, and may provide a buffer space for reading/writing data from/to the memory cells in the memory cell array 600. The Y-gating circuit 720 may select one of the page buffers in the page buffer block 710 corresponding to some of the memory cells in accordance with the operation signals of the control/decoder circuit 600.

According to the memory system of example embodiments, the charge trap sites may be reduced on the dielectric pattern interposed between the floating gate electrode and the control gate line, to thereby improve the data retention characteristics of the memory device and operation reliability of the memory system.

The above memory system 1000 may be applied to various electronic instruments. For example, various memory cards may be manufactured to have the memory system 1000 based on industrial standards, and the memory cards may be applied to various portable electronic instruments (e.g., a digital camera, a notebook computer, and an MP3 player) for storing audio and video data. In such a case, the memory system 100 may further include a decoder (not illustrated) and an encoder (not illustrated) for converting analogue audio, video and image data into respective digital data. In addition, the memory system 1000 may be directly connected to a central processing unit (CPU) of a computer system or may be indirectly connected to the CPU via a bus line, and thus may function as a supplementary memory or a storage device for the computer system.

According to example embodiments of the present inventive concepts, the etch-proof layer and the spacer layer may be formed on the sidewalls of the stack gate structure, to thereby prevent the over-etch against the sidewalls of the floating gate pattern and the control gate line and the charge trap sites on the surface of the inter-gate dielectric pattern interposed between the floating gate electrode and the control gate line. Therefore, the charges stored in the floating gate electrode may be prevented from being discharged into the charge trap sites, thereby increase the data retention characteristics of the memory cells. In addition, the prevention of the over-etch against the sidewalls of the floating gate pattern and the control gate line may cause the reduction of the line width of the stack gate structure, to thereby prevent the reduction of the coupling ratio of the stack gate structure.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a non-volatile memory device, comprising:

forming a first dielectric pattern and a floating gate pattern on an active region of a semiconductor substrate defined by a device isolation pattern of the semiconductor substrate, the floating gate pattern extending in a first direction and the device isolation pattern being exposed through a recess between a pair of the floating gate patterns adjacent to each other in a second direction substantially perpendicular to the first direction;

forming a second dielectric layer to cover the floating gate pattern and the device isolation pattern exposed through the recess;

forming a control gate layer on the second dielectric layer to a thickness to fill up the recess;

partially removing the control gate layer to form a plurality of control gate lines extending in the second direction such that the second dielectric layer is exposed through a gap space between a pair of the plurality of control gate lines adjacent to each other in the first direction;

forming a first etch-proof layer on a sidewall of the plurality of control gate lines that is exposed to the gap space, the first etch-proof layer including an oxide;

sequentially removing the second dielectric layer and the floating gate pattern under the second dielectric layer exposed through the gap space to form a second dielectric pattern extending in the second direction and a floating gate electrode under the second dielectric pattern by a unit of a memory cell, so that the floating gate electrode, the second dielectric pattern and the control gate line are stacked at each of the memory cells to form a conductive stack structure at each cell; and forming a spacer layer on sidewalls of the conductive stack structure.

2. The method of claim 1, wherein the partially removing of the control gate layer includes repeatedly performing a first etching process, the forming of the first etch-proof layer includes repeatedly performing a second etching process, and the first etching process and the second etching process are performed alternately with each other.

3. The method of claim 1, wherein the partially removing of the control gate layer includes performing a first etching process, and the forming of the first etch-proof layer includes performing a first oxidation process, the first etching process includes a first step for removing an upper portion of the control gate layer until an upper surface of the second dielectric layer is exposed to form an upper portion of the control gate line, and a second step for removing a lower portion of the control gate layer until the second dielectric pattern in the recess is exposed over the device isolation pattern to form a lower portion of the control gate line, and the first oxidation process includes a first step performed after the first step of the first etching process and forming an upper portion of the first etch-proof layer on the sidewall of the upper control line, and a second step performed after the second step of the first etching process and forming a lower portion of the first etch-proof layer on the sidewall of the lower control line in the recess.

4. The method of claim 3, wherein the first etching process includes a plasma etching process in which an etching rate of the control gate layer is about 2 times to about 4 times an etching rate of the second dielectric layer, and the first oxidation process includes a plasma oxidation process.

5. The method of claim 3, wherein the forming of the second dielectric pattern and the forming floating gate electrode under the second dielectric pattern includes:

removing the second dielectric layer and an upper portion of the floating gate pattern exposed through the gap space by performing a second etching process to form residuals of the floating gate pattern in which an upper sidewall of the floating gate pattern is exposed through the gap space; and removing the residuals of the floating gate pattern by performing a third etching process to form the floating gate electrode and to expose the first dielectric pattern in the gap space, the floating gate electrode being node-separated at each of the cells.

6. The method of claim 5, wherein the performing of the second etching process includes performing a plasma etching process in which an etching rate of the second dielectric layer is about 2 times to about 4 times an etching rate of the floating gate pattern.

7. The method of claim 6, further comprising forming a second etch-proof layer on the upper sidewall of the floating gate pattern before performing the third etching process, the second etch-proof layer including an oxide layer.

8. The method of claim 7, wherein the forming of the second etch-proof layer includes performing a second oxidation process.

9. The method of claim 7, wherein the third etching process includes performing a partial etching process at least two times.

10. The method of claim 9, further comprising forming additional etch-proof layers on a lower sidewall of the floating gate pattern between the partial etching processes of the third etching process.

11. A method of manufacturing a non-volatile memory device, comprising:

forming a first dielectric pattern and a floating gate pattern on an active region of a semiconductor substrate, wherein the active layer is defined by a device isolation pattern of the semiconductor substrate, the floating gate pattern extends in a first direction, and the device isolation pattern is exposed in an area between adjacent floating gates of the floating gate pattern, the adjacent floating gates extending in a second direction substantially perpendicular to the first direction;

forming a second dielectric layer to cover the floating gate pattern and the exposed device isolation pattern;

forming a control gate layer on the second dielectric layer to a thickness to fill up the area between the adjacent floating gates;

partially removing the control gate layer to form a plurality of control gate lines extending in the second direction such that the second dielectric layer is exposed through a space between adjacent control gate lines of the plurality of control gate lines in the first direction;

forming an oxide layer on a sidewall of the plurality of control gate lines that is exposed in the space between the adjacent control gate lines;

sequentially removing the second dielectric layer and the floating gate pattern under the second dielectric layer exposed through the space to form a second dielectric pattern extending in the second direction and a floating gate electrode under the second dielectric pattern by a unit of a memory cell, so that the floating gate electrode, the second dielectric pattern and the control gate line are stacked at each of the memory cells to form a conductive stack structure at each cell; and forming a spacer layer on sidewalls of the conductive stack structure.

12. The method of claim 11, wherein a recess is in the space between the adjacent control gate lines.

13. The method of claim 12, wherein the oxide layer is an etch-stop layer.

* * * * *